(12) United States Patent
Alokozai et al.

(10) Patent No.: US 9,021,985 B2
(45) Date of Patent: May 5, 2015

(54) PROCESS GAS MANAGEMENT FOR AN INDUCTIVELY-COUPLED PLASMA DEPOSITION REACTOR

(75) Inventors: Fred Alokozai, Fremont, CA (US); Robert Brennan Milligan, Gold Canyon, AZ (US)

(73) Assignee: ASM IP Holdings B.V., Almere (NL)

(*) Notice: Subject to any disclaimer, the term of this patent is extended or adjusted under 35 U.S.C. 154(b) by 0 days.

(21) Appl. No.: 13/612,538

(22) Filed: Sep. 12, 2012

(65) Prior Publication Data

US 2014/0073143 A1    Mar. 13, 2014

(51) Int. Cl.
| | |
|---|---|
| C23C 16/505 | (2006.01) |
| C23C 16/452 | (2006.01) |
| C23C 16/455 | (2006.01) |
| C23C 16/507 | (2006.01) |
| H01J 37/32 | (2006.01) |

(52) U.S. Cl.
CPC ......... *C23C 16/452* (2013.01); *C23C 16/45563* (2013.01); *C23C 16/507* (2013.01); *H01J 37/321* (2013.01); *H01J 37/3244* (2013.01)

(58) Field of Classification Search
USPC ....................................................... 118/723 I
See application file for complete search history.

(56) References Cited

U.S. PATENT DOCUMENTS

| | | | |
|---|---|---|---|
| 2,745,640 A | 5/1956 | Cushman | |
| 2,990,045 A | 9/1959 | Root | |
| 3,833,492 A | 9/1974 | Bollyky | |
| 3,854,443 A | 12/1974 | Baerg | |
| 3,862,397 A | 1/1975 | Anderson et al. | |
| 3,887,790 A | 6/1975 | Ferguson | |
| 4,058,430 A | 11/1977 | Suntola et al. | |
| 4,176,630 A | 12/1979 | Elmer | |

(Continued)

FOREIGN PATENT DOCUMENTS

| | | |
|---|---|---|
| CN | 1563483 A | 1/2005 |
| CN | 101330015 | 12/2008 |

(Continued)

OTHER PUBLICATIONS

USPTO; Office Action dated Aug. 27, 2010 in U.S. Appl. No. 12/118,596.

(Continued)

*Primary Examiner* — Charles Garber
*Assistant Examiner* — Stanetta Isaac
(74) *Attorney, Agent, or Firm* — Snell & Wilmer LLP

(57) ABSTRACT

Embodiments related to hardware and methods for processing a semiconductor substrate are disclosed. One example film deposition reactor includes a process gas distributor including a plasma gas-feed inlet located to supply plasma gas to a plasma generation region within the film deposition reactor and a precursor gas-feed inlet located to supply film precursor gas downstream of the plasma generation region; an insulating confinement vessel configured to maintain a plasma generation region at a reduced pressure within the film deposition reactor and an inductively-coupled plasma (ICP) coil arranged around a portion of a sidewall of the insulating confinement vessel and positioned so that the sidewall separates the plasma generation region from the ICP coil; and a susceptor configured to support the semiconductor substrate so that a film deposition surface of the semiconductor substrate is exposed to a reaction region formed downstream of the process gas distributor.

16 Claims, 7 Drawing Sheets

(56) References Cited

U.S. PATENT DOCUMENTS

| | | |
|---|---|---|
| 4,194,536 A | 3/1980 | Stine et al. |
| 4,389,973 A | 6/1983 | Suntola et al. |
| 4,393,013 A | 7/1983 | McMenamin |
| 4,436,674 A | 3/1984 | McMenamin |
| 4,570,328 A | 2/1986 | Price et al. |
| 4,653,541 A | 3/1987 | Oehlschlaeger et al. |
| 4,722,298 A | 2/1988 | Rubin et al. |
| 4,735,259 A | 4/1988 | Vincent |
| 4,753,192 A | 6/1988 | Goldsmith et al. |
| 4,789,294 A | 12/1988 | Sato et al. |
| 4,821,674 A | 4/1989 | deBoer et al. |
| 4,827,430 A | 5/1989 | Aid et al. |
| 4,991,614 A | 2/1991 | Hammel |
| 5,062,386 A | 11/1991 | Christensen |
| 5,119,760 A | 6/1992 | McMillan et al. |
| 5,167,716 A | 12/1992 | Boitnott et al. |
| 5,199,603 A | 4/1993 | Prescott |
| 5,221,556 A | 6/1993 | Hawkins et al. |
| 5,242,539 A | 9/1993 | Kumihashi et al. |
| 5,243,195 A | 9/1993 | Nishi |
| 5,326,427 A | 7/1994 | Jerbic |
| 5,380,367 A | 1/1995 | Bertone |
| 5,595,606 A | 1/1997 | Fujikawa et al. |
| 5,632,919 A | 5/1997 | MacCracken et al. |
| 5,730,801 A | 3/1998 | Tepman |
| 5,732,744 A | 3/1998 | Barr et al. |
| 5,736,314 A | 4/1998 | Hayes et al. |
| 5,796,074 A | 8/1998 | Edelstein et al. |
| 5,836,483 A | 11/1998 | Disel |
| 5,855,680 A | 1/1999 | Soininen et al. |
| 5,979,506 A | 11/1999 | Aarseth |
| 6,013,553 A | 1/2000 | Wallace |
| 6,015,465 A | 1/2000 | Kholodenko et al. |
| 6,060,691 A | 5/2000 | Minami et al. |
| 6,074,443 A | 6/2000 | Venkatesh |
| 6,083,321 A | 7/2000 | Lei et al. |
| 6,086,677 A | 7/2000 | Umotoy et al. |
| 6,122,036 A | 9/2000 | Yamasaki et al. |
| 6,125,789 A | 10/2000 | Gupta et al. |
| 6,129,044 A | 10/2000 | Zhao et al. |
| 6,148,761 A | 11/2000 | Majewski et al. |
| 6,161,500 A | 12/2000 | Kopacz et al. |
| 6,201,999 B1 | 3/2001 | Jevtic |
| 6,274,878 B1 | 8/2001 | Li et al. |
| 6,287,965 B1 | 9/2001 | Kang et al. |
| 6,302,964 B1 | 10/2001 | Umotoy et al. |
| 6,312,525 B1 | 11/2001 | Bright et al. |
| 6,326,597 B1 | 12/2001 | Lubomirsky et al. |
| 6,342,427 B1 | 1/2002 | Choi et al. |
| 6,367,410 B1 | 4/2002 | Leahey et al. |
| 6,368,987 B1 | 4/2002 | Kopacz et al. |
| 6,410,459 B2 | 6/2002 | Blalock et al. |
| 6,420,279 B1 | 7/2002 | Ono et al. |
| 6,454,860 B2 | 9/2002 | Metzner et al. |
| 6,478,872 B1 | 11/2002 | Chae et al. |
| 6,482,331 B2 | 11/2002 | Lu et al. |
| 6,483,989 B1 | 11/2002 | Okada et al. |
| 6,511,539 B1 | 1/2003 | Raaijmakers |
| 6,534,395 B2 | 3/2003 | Werkhoven et al. |
| 6,569,239 B2 | 5/2003 | Arai et al. |
| 6,590,251 B2 | 7/2003 | Kang et al. |
| 6,594,550 B1 | 7/2003 | Okrah |
| 6,598,559 B1 | 7/2003 | Vellore et al. |
| 6,627,503 B2 | 9/2003 | Ma et al. |
| 6,633,364 B2 | 10/2003 | Hayashi |
| 6,648,974 B1 | 11/2003 | Ogliari et al. |
| 6,682,973 B1 | 1/2004 | Paton et al. |
| 6,709,989 B2 | 3/2004 | Ramdani et al. |
| 6,710,364 B2 | 3/2004 | Guldi et al. |
| 6,734,090 B2 | 5/2004 | Agarwala et al. |
| 6,820,570 B2 | 11/2004 | Kilpela et al. |
| 6,821,910 B2 | 11/2004 | Adomaitis et al. |
| 6,824,665 B2 | 11/2004 | Shelnut et al. |
| 6,847,014 B1 | 1/2005 | Benjamin et al. |
| 6,858,547 B2 | 2/2005 | Metzner |
| 6,863,019 B2 | 3/2005 | Shamouilian |
| 6,874,480 B1 | 4/2005 | Ismailov |
| 6,875,677 B1 | 4/2005 | Conley, Jr. et al. |
| 6,884,066 B2 | 4/2005 | Nguyen et al. |
| 6,889,864 B2 | 5/2005 | Lindfors et al. |
| 6,909,839 B2 | 6/2005 | Wang et al. |
| 6,930,059 B2 | 8/2005 | Conley, Jr. et al. |
| 6,935,269 B2 | 8/2005 | Lee et al. |
| 6,955,836 B2 | 10/2005 | Kumagai et al. |
| 7,045,430 B2 | 5/2006 | Ahn et al. |
| 7,053,009 B2 | 5/2006 | Conley, Jr. et al. |
| 7,071,051 B1 | 7/2006 | Jeon et al. |
| 7,115,838 B2 | 10/2006 | Kurara et al. |
| 7,122,085 B2 | 10/2006 | Shero et al. |
| 7,129,165 B2 | 10/2006 | Basol et al. |
| 7,132,360 B2 | 11/2006 | Schaeffer et al. |
| 7,135,421 B2 | 11/2006 | Ahn et al. |
| 7,147,766 B2 | 12/2006 | Uzoh et al. |
| 7,172,497 B2 | 2/2007 | Basol et al. |
| 7,192,824 B2 | 3/2007 | Ahn et al. |
| 7,192,892 B2 | 3/2007 | Ahn et al. |
| 7,195,693 B2 | 3/2007 | Cowans |
| 7,204,887 B2 | 4/2007 | Kawamura et al. |
| 7,205,247 B2 | 4/2007 | Lee et al. |
| 7,235,501 B2 | 6/2007 | Ahn et al. |
| 7,312,494 B2 | 12/2007 | Ahn et al. |
| 7,329,947 B2 | 2/2008 | Adachi et al. |
| 7,357,138 B2 | 4/2008 | Ji et al. |
| 7,393,736 B2 | 7/2008 | Ahn et al. |
| 7,402,534 B2 | 7/2008 | Mahajani |
| 7,405,166 B2 | 7/2008 | Liang et al. |
| 7,405,454 B2 | 7/2008 | Ahn et al. |
| 7,414,281 B1 | 8/2008 | Fastow |
| 7,437,060 B2 | 10/2008 | Wang et al. |
| 7,442,275 B2 | 10/2008 | Cowans |
| 7,489,389 B2 | 2/2009 | Shibazaki |
| 7,547,363 B2 | 6/2009 | Tomiyasu et al. |
| 7,601,223 B2 | 10/2009 | Lindfors et al. |
| 7,601,225 B2 | 10/2009 | Tuominen et al. |
| 7,640,142 B2 | 12/2009 | Tachikawa et al. |
| 7,651,583 B2 | 1/2010 | Kent et al. |
| D614,153 S | 4/2010 | Fondurulia et al. |
| 7,720,560 B2 | 5/2010 | Menser et al. |
| 7,723,648 B2 | 5/2010 | Tsukamoto et al. |
| 7,740,705 B2 | 6/2010 | Li |
| 7,780,440 B2 | 8/2010 | Shibagaki et al. |
| 7,833,353 B2 | 11/2010 | Furukawahara et al. |
| 7,851,019 B2 | 12/2010 | Tuominen et al. |
| 7,884,918 B2 | 2/2011 | Hattori |
| 8,041,197 B2 | 10/2011 | Kasai et al. |
| 8,055,378 B2 | 11/2011 | Numakura |
| 8,071,451 B2 | 12/2011 | Berry |
| 8,071,452 B2 | 12/2011 | Raisanen |
| 8,072,578 B2 | 12/2011 | Yasuda |
| 8,076,230 B2 | 12/2011 | Wei |
| 8,082,946 B2 | 12/2011 | Laverdiere et al. |
| 8,092,604 B2 | 1/2012 | Tomiyasu et al. |
| 8,137,462 B2 | 3/2012 | Fondurulia et al. |
| 8,147,242 B2 | 4/2012 | Shibagaki et al. |
| 8,216,380 B2 | 7/2012 | White et al. |
| 8,278,176 B2 | 10/2012 | Bauer et al. |
| 8,282,769 B2 | 10/2012 | Iizuka |
| 8,287,648 B2 | 10/2012 | Reed et al. |
| 8,293,016 B2 | 10/2012 | Bahng et al. |
| 8,309,173 B2 | 11/2012 | Tuominen et al. |
| 8,367,528 B2 | 2/2013 | Bauer et al. |
| 8,444,120 B2 | 5/2013 | Gregg et al. |
| 8,608,885 B2 | 12/2013 | Goto et al. |
| 8,683,943 B2 | 4/2014 | Onodera et al. |
| 8,711,338 B2 | 4/2014 | Liu et al. |
| 8,726,837 B2 | 5/2014 | Patalay et al. |
| 8,728,832 B2 | 5/2014 | Raisanen et al. |
| 8,802,201 B2 | 8/2014 | Raisanen et al. |
| 8,877,655 B2 | 11/2014 | Shero et al. |
| 8,883,270 B2 | 11/2014 | Shero et al. |
| 2002/0001974 A1 | 1/2002 | Chan |
| 2002/0011210 A1 | 1/2002 | Satoh et al. |
| 2002/0064592 A1 | 5/2002 | Datta et al. |
| 2002/0098627 A1 | 7/2002 | Pomarede et al. |

(56) References Cited

U.S. PATENT DOCUMENTS

| | | |
|---|---|---|
| 2002/0108670 A1 | 8/2002 | Baker et al. |
| 2002/0115252 A1 | 8/2002 | Haukka et al. |
| 2002/0172768 A1 | 11/2002 | Endo et al. |
| 2002/0187650 A1 | 12/2002 | Blalock et al. |
| 2003/0019580 A1* | 1/2003 | Strang ............... 156/345.33 |
| 2003/0025146 A1 | 2/2003 | Narwankar et al. |
| 2003/0042419 A1 | 3/2003 | Katsumata et al. |
| 2003/0066826 A1 | 4/2003 | Lee et al. |
| 2003/0075925 A1 | 4/2003 | Lindfors et al. |
| 2003/0111963 A1* | 6/2003 | Tolmachev et al. ...... 315/111.51 |
| 2003/0141820 A1 | 7/2003 | White et al. |
| 2003/0228772 A1 | 12/2003 | Cowans |
| 2003/0232138 A1 | 12/2003 | Tuominen et al. |
| 2004/0013577 A1 | 1/2004 | Ganguli et al. |
| 2004/0023516 A1 | 2/2004 | Londergan et al. |
| 2004/0077182 A1 | 4/2004 | Lim et al. |
| 2004/0144980 A1 | 7/2004 | Ahn et al. |
| 2004/0168627 A1 | 9/2004 | Conley et al. |
| 2004/0169032 A1 | 9/2004 | Murayama et al. |
| 2004/0198069 A1 | 10/2004 | Metzner et al. |
| 2004/0200499 A1 | 10/2004 | Harvey et al. |
| 2004/0219793 A1 | 11/2004 | Hishiya et al. |
| 2004/0221807 A1 | 11/2004 | Verghese et al. |
| 2004/0266011 A1 | 12/2004 | Lee et al. |
| 2005/0008799 A1 | 1/2005 | Tomiyasu et al. |
| 2005/0019026 A1 | 1/2005 | Wang et al. |
| 2005/0020071 A1 | 1/2005 | Sonobe et al. |
| 2005/0023624 A1 | 2/2005 | Ahn et al. |
| 2005/0054228 A1 | 3/2005 | March |
| 2005/0066893 A1 | 3/2005 | Soininen |
| 2005/0070123 A1 | 3/2005 | Hirano |
| 2005/0072357 A1 | 4/2005 | Shero et al. |
| 2005/0092249 A1 | 5/2005 | Kilpela et al. |
| 2005/0100669 A1 | 5/2005 | Kools et al. |
| 2005/0106893 A1 | 5/2005 | Wilk |
| 2005/0110069 A1 | 5/2005 | Kil et al. |
| 2005/0173003 A1 | 8/2005 | Laverdiere et al. |
| 2005/0187647 A1 | 8/2005 | Wang et al. |
| 2005/0212119 A1 | 9/2005 | Shero |
| 2005/0214457 A1 | 9/2005 | Schmitt et al. |
| 2005/0214458 A1 | 9/2005 | Meiere |
| 2005/0218462 A1 | 10/2005 | Ahn et al. |
| 2005/0229972 A1 | 10/2005 | Hoshi et al. |
| 2005/0241176 A1 | 11/2005 | Shero et al. |
| 2005/0263075 A1 | 12/2005 | Wang et al. |
| 2005/0271813 A1 | 12/2005 | Kher et al. |
| 2005/0282101 A1 | 12/2005 | Adachi |
| 2006/0013946 A1 | 1/2006 | Park et al. |
| 2006/0014384 A1 | 1/2006 | Lee et al. |
| 2006/0019033 A1 | 1/2006 | Muthukrishnan et al. |
| 2006/0024439 A2 | 2/2006 | Tuominen et al. |
| 2006/0046518 A1 | 3/2006 | Hill et al. |
| 2006/0051925 A1 | 3/2006 | Ahn et al. |
| 2006/0060930 A1 | 3/2006 | Metz et al. |
| 2006/0062910 A1 | 3/2006 | Meiere |
| 2006/0063346 A1 | 3/2006 | Lee et al. |
| 2006/0110934 A1 | 5/2006 | Fukuchi |
| 2006/0113675 A1 | 6/2006 | Chang et al. |
| 2006/0128168 A1 | 6/2006 | Ahn et al. |
| 2006/0148180 A1 | 7/2006 | Ahn et al. |
| 2006/0193979 A1 | 8/2006 | Meiere et al. |
| 2006/0208215 A1 | 9/2006 | Metzner et al. |
| 2006/0213439 A1 | 9/2006 | Ishizaka |
| 2006/0223301 A1 | 10/2006 | Vanhaelemeersch et al. |
| 2006/0226117 A1 | 10/2006 | Bertram et al. |
| 2006/0228888 A1 | 10/2006 | Lee et al. |
| 2006/0240574 A1 | 10/2006 | Yoshie |
| 2006/0257563 A1 | 11/2006 | Doh et al. |
| 2006/0258078 A1 | 11/2006 | Lee et al. |
| 2006/0266289 A1 | 11/2006 | Verghese et al. |
| 2007/0010072 A1 | 1/2007 | Bailey et al. |
| 2007/0020953 A1 | 1/2007 | Tsai et al. |
| 2007/0022954 A1 | 2/2007 | Iizuka et al. |
| 2007/0028842 A1 | 2/2007 | Inagawa et al. |
| 2007/0031598 A1 | 2/2007 | Okuyama et al. |
| 2007/0031599 A1 | 2/2007 | Gschwandtner et al. |
| 2007/0037412 A1 | 2/2007 | Dip et al. |
| 2007/0042117 A1 | 2/2007 | Kupurao et al. |
| 2007/0049053 A1 | 3/2007 | Mahajani |
| 2007/0059948 A1 | 3/2007 | Metzner et al. |
| 2007/0065578 A1 | 3/2007 | McDougall |
| 2007/0066010 A1 | 3/2007 | Ando |
| 2007/0054405 A1 | 4/2007 | Kim |
| 2007/0077355 A1 | 4/2007 | Chacin et al. |
| 2007/0084405 A1* | 4/2007 | Kim ............... 118/723.001 |
| 2007/0116873 A1 | 5/2007 | Li et al. |
| 2007/0134942 A1 | 6/2007 | Ahn et al. |
| 2007/0146621 A1 | 6/2007 | Yeom |
| 2007/0155138 A1 | 7/2007 | Tomasini et al. |
| 2007/0166457 A1 | 7/2007 | Yamoto et al. |
| 2007/0175397 A1 | 8/2007 | Tomiyasu et al. |
| 2007/0209590 A1 | 9/2007 | Li |
| 2007/0232501 A1 | 10/2007 | Tonomura |
| 2007/0249131 A1 | 10/2007 | Allen et al. |
| 2007/0252244 A1 | 11/2007 | Srividya et al. |
| 2007/0264807 A1 | 11/2007 | Leone et al. |
| 2008/0006208 A1 | 1/2008 | Ueno et al. |
| 2008/0029790 A1 | 2/2008 | Ahn et al. |
| 2008/0054332 A1 | 3/2008 | Kim et al. |
| 2008/0057659 A1 | 3/2008 | Forbes et al. |
| 2008/0075881 A1 | 3/2008 | Won et al. |
| 2008/0085226 A1 | 4/2008 | Fondurulia et al. |
| 2008/0113096 A1 | 5/2008 | Mahajani |
| 2008/0113097 A1 | 5/2008 | Mahajani et al. |
| 2008/0124908 A1 | 5/2008 | Forbes et al. |
| 2008/0149031 A1 | 6/2008 | Chu et al. |
| 2008/0176375 A1 | 7/2008 | Erben et al. |
| 2008/0216077 A1 | 9/2008 | Emani et al. |
| 2008/0224240 A1 | 9/2008 | Ahn et al. |
| 2008/0233288 A1 | 9/2008 | Clark |
| 2008/0261413 A1 | 10/2008 | Mahajani |
| 2008/0282970 A1 | 11/2008 | Heys et al. |
| 2008/0315292 A1 | 12/2008 | Ji et al. |
| 2009/0000550 A1 | 1/2009 | Tran et al. |
| 2009/0011608 A1 | 1/2009 | Nabatame |
| 2009/0020072 A1 | 1/2009 | Mizunaga et al. |
| 2009/0029564 A1 | 1/2009 | Yamashita et al. |
| 2009/0035947 A1 | 2/2009 | Horii |
| 2009/0061644 A1 | 3/2009 | Chiang et al. |
| 2009/0085156 A1 | 4/2009 | Dewey et al. |
| 2009/0095221 A1 | 4/2009 | Tam et al. |
| 2009/0107404 A1 | 4/2009 | Ogliari et al. |
| 2009/0136668 A1 | 5/2009 | Gregg et al. |
| 2009/0211523 A1 | 8/2009 | Kuppurao et al. |
| 2009/0211525 A1 | 8/2009 | Sarigiannis et al. |
| 2009/0239386 A1 | 9/2009 | Suzaki et al. |
| 2009/0242957 A1 | 10/2009 | Ma et al. |
| 2009/0246374 A1* | 10/2009 | Vukovic ............... 427/255.28 |
| 2009/0261331 A1 | 10/2009 | Yang et al. |
| 2009/0277510 A1 | 11/2009 | Shikata |
| 2009/0283041 A1 | 11/2009 | Tomiyasu et al. |
| 2010/0024727 A1 | 2/2010 | Kim et al. |
| 2010/0025796 A1 | 2/2010 | Dabiran |
| 2010/0055312 A1 | 3/2010 | Kato et al. |
| 2010/0075507 A1 | 3/2010 | Chang et al. |
| 2010/0124610 A1 | 5/2010 | Aikawa et al. |
| 2010/0130017 A1 | 5/2010 | Luo et al. |
| 2010/0170441 A1 | 7/2010 | Won et al. |
| 2010/0193501 A1 | 8/2010 | Zucker et al. |
| 2010/0230051 A1 | 9/2010 | Iizuka |
| 2010/0255198 A1 | 10/2010 | Cleary et al. |
| 2010/0275846 A1 | 11/2010 | Kitagawa |
| 2010/0294199 A1 | 11/2010 | Tran et al. |
| 2010/0307415 A1 | 12/2010 | Shero et al. |
| 2010/0322604 A1 | 12/2010 | Fondurulia et al. |
| 2011/0000619 A1* | 1/2011 | Suh ............... 156/345.33 |
| 2011/0061810 A1 | 3/2011 | Ganguly et al. |
| 2011/0070380 A1 | 3/2011 | Shero et al. |
| 2011/0097901 A1* | 4/2011 | Banna et al. ............... 438/710 |
| 2011/0108194 A1* | 5/2011 | Yoshioka et al. ......... 156/345.35 |
| 2011/0236600 A1 | 9/2011 | Fox et al. |
| 2011/0239936 A1 | 10/2011 | Suzaki et al. |
| 2011/0256734 A1* | 10/2011 | Hausmann et al. ........... 438/776 |
| 2011/0275166 A1 | 11/2011 | Shero et al. |

(56) References Cited

U.S. PATENT DOCUMENTS

| | | |
|---|---|---|
| 2011/0308460 A1 | 12/2011 | Hong et al. |
| 2012/0024479 A1 | 2/2012 | Palagashvili et al. |
| 2012/0070997 A1 | 3/2012 | Larson |
| 2012/0090704 A1 | 4/2012 | Laverdiere et al. |
| 2012/0098107 A1 | 4/2012 | Raisanen et al. |
| 2012/0114877 A1 | 5/2012 | Lee |
| 2012/0156108 A1 | 6/2012 | Fondurulia et al. |
| 2012/0160172 A1 | 6/2012 | Wamura et al. |
| 2012/0240858 A1 | 9/2012 | Taniyama et al. |
| 2012/0289053 A1 | 11/2012 | Holland et al. |
| 2012/0295427 A1 | 11/2012 | Bauer |
| 2012/0304935 A1 | 12/2012 | Oosterlaken et al. |
| 2013/0023129 A1 | 1/2013 | Reed |
| 2013/0104988 A1 | 5/2013 | Yednak et al. |
| 2013/0104992 A1 | 5/2013 | Yednak et al. |
| 2013/0126515 A1 | 5/2013 | Shero et al. |
| 2013/0129577 A1 | 5/2013 | Halpin et al. |
| 2013/0230814 A1 | 9/2013 | Dunn et al. |
| 2013/0264659 A1 | 10/2013 | Jung |
| 2013/0292676 A1 | 11/2013 | Milligan et al. |
| 2013/0292807 A1 | 11/2013 | Raisanen et al. |
| 2014/0000843 A1 | 1/2014 | Dunn et al. |
| 2014/0014644 A1 | 1/2014 | Akiba et al. |
| 2014/0027884 A1 | 1/2014 | Fang et al. |
| 2014/0036274 A1 | 2/2014 | Marquardt et al. |
| 2014/0060147 A1 | 3/2014 | Sarin et al. |
| 2014/0067110 A1 | 3/2014 | Lawson et al. |
| 2014/0073143 A1 | 3/2014 | Alokozai et al. |
| 2014/0084341 A1 | 3/2014 | Weeks |
| 2014/0103145 A1 | 4/2014 | White et al. |
| 2014/0120487 A1 | 5/2014 | Kaneko |
| 2014/0159170 A1 | 6/2014 | Raisanen et al. |
| 2014/0175054 A1 | 6/2014 | Carlson et al. |
| 2014/0217065 A1 | 8/2014 | Winkler et al. |
| 2014/0220247 A1 | 8/2014 | Haukka et al. |
| 2014/0251953 A1 | 9/2014 | Winkler et al. |
| 2014/0251954 A1 | 9/2014 | Winkler et al. |
| 2014/0346650 A1 | 11/2014 | Raisanen et al. |
| 2015/0024609 A1 | 1/2015 | Milligan et al. |
| 2015/0048485 A1 | 2/2015 | Tolle |

FOREIGN PATENT DOCUMENTS

| | | |
|---|---|---|
| CN | 101522943 | 9/2009 |
| CN | 101423937 | 9/2011 |
| JP | 07283149 | 10/1995 |
| JP | 08335558 | 12/1996 |
| JP | 2001342570 | 12/2001 |
| JP | 2004014952 A | 1/2004 |
| JP | 2004091848 | 3/2004 |
| JP | 2004538374 | 12/2004 |
| JP | 2005507030 | 3/2005 |
| JP | 2006186271 | 7/2006 |
| JP | 2008527748 | 7/2008 |
| TW | 1226380 | 1/2005 |
| TW | 200701301 A | 1/2007 |
| WO | 2006056091 A1 | 6/2006 |
| WO | 2006/078666 | 7/2006 |

OTHER PUBLICATIONS

USPTO; Office Action dated Feb. 15, 2011 in U.S. Appl. No. 12/118,596.
USPTO; Notice of Allowance dated Aug. 4, 2011 in U.S. Appl. No. 12/118,596.
USPTO; Notice of Allowance dated Jun. 16, 2011 in U.S. Appl. No. 12/430,751.
USPTO; Notice of Allowance dated Jul. 27, 2011 in U.S. Appl. No. 12/430,751.
USPTO; Office Action dated Apr. 23, 2013 in U.S. Appl. No. 12/763,037.
USPTO; Office Action dated Jan. 15, 2013 in U.S. Appl. No. 12/754,223.
USPTO; Office Action dated Feb. 26, 2013 in U.S. Appl. No. 12/754,223.
PCT; International Search report and Written Opinion dated Nov. 12, 2010 in Application No. PCT/US2010/030126.
PCT; International Search report and Written Opinion dated Jan. 12, 2011 in Application No. PCT/US2010/045368.
PCT; International Search report and Written Opinion dated Feb. 6, 2013 in Application No. PCT/US2012/065343.
PCT; International Search report and Written Opinion dated Feb. 13, 2013 in Application No. PCT/US2012/065347.
Chinese Patent Office; Office Action dated Jan. 10, 2013 is Serial No. 201080015699.9.
Chang et al. Small-Subthreshold-Swing and Low-Voltage Flexible Organic Thin-Film Transistors Which Use HfLaO as the Gate Dielectric; IEEE Electron Device Letters; Feb. 2009; 133-135; vol. 30, No. 2; IEEE Electron Device Society.
Maeng et al. Electrical properties of atomic layer disposition Hf02 and Hf0xNy on Si substrates with various crystal orientations, Journal of the Electrochemical Society, Apr. 2008, p. H267-H271, vol. 155, No. 4, Department of Materials Science and Engineering, Pohang University of Science and Technology, Pohang, Korea.
Novaro et al. Theoretical Study on a Reaction Pathway of Ziegler-Natta-Type Catalysis, J. Chem. Phys. 68(5), Mar. 1, 1978 p. 2337-2351.
USPTO; Final Office Action dated Jun. 28, 2013 in U.S. Appl. No. 12/754,223.
USPTO; Office Action dated Feb. 25, 2014 in U.S. Appl. No. 12/754,223.
USPTO; Restriction Requirement dated Sep. 25, 2012 in U.S. Appl. No. 12/854,818.
USPTO; Office Action dated Dec. 6, 2012 in U.S. Appl. No. 12/854,818.
USPTO; Final Office Action dated Mar. 13, 2013 in U.S. Appl. No. 12/854,818.
USPTO; Office Action dated Aug. 30, 2013 in U.S. Appl. No. 12/854,818.
USPTO; Final Office Action dated Mar. 26, 2014 in U.S. Appl. No. 12/854,818.
USPTO; Restriction Requirement dated May 8, 2013 in U.S. Appl. No. 13/102,980.
USPTO; Office Action dated Oct. 7, 2013 in U.S. Appl. No. 13/102,980.
USPTO; Final Office Action dated Mar. 25, 2014 in U.S. Appl. No. 13/102,980.
USPTO; Restriction Requirement dated Dec. 16, 2013 in U.S. Appl. No. 13/284,642.
USPTO; Office Action dated Jan. 28, 2014 in U.S. Appl. No. 13/312,591.
USPTO; Final Office Action dated May 14, 2014 in U.S. Appl. No. 13/312,591.
USPTO; Office Action dated Jan. 10, 2013 in U.S. Appl. No. 13/339,609.
USPTO; Office Action dated Feb. 11, 2013 in U.S. Appl. No. 13/339,609.
USPTO; Final Office Action dated May 17, 2013 in U.S. Appl. No. 13/339,609.
USPTO; Office Action dated Aug. 29, 2013 in U.S. Appl. No. 13/339,609.
USPTO; Final Office Action dated Dec. 18, 2013 in U.S. Appl. No. 13/339,609.
USPTO; Notice of Allowance dated Apr. 7, 2014 in U.S. Appl. No. 13/339,609.
USPTO; Office Action dated Feb. 13, 2014 in U.S. Appl. No. 13/411,271.
USPTO; Restriction Requirement dated Oct. 29, 2013 in U.S. Appl. No. 13/439,258.
USPTO; Office Action dated Mar. 24, 2014 in U.S. Appl. No. 13/439,258.
USPTO; Office Action dated May 23, 2013 in U.S. Appl. No. 13/465,340.
USPTO; Final Office Action dated Oct. 30, 2013 in U.S. Appl. No. 13/465,340.

(56) References Cited

OTHER PUBLICATIONS

USPTO; Notice of Allowance dated Feb. 12, 2014 in U.S. Appl. No. 13/465,340.
USPTO; Office Action dated Dec. 20, 2013 in U.S. Appl. No. 13/535,214.
USPTO; Office Action dated Nov. 15, 2013 in U.S. Appl. No. 13/612,538.
USPTO; Office Action dated Apr. 24, 2014 in U.S. Appl. No. 13/784,362.
Chinese Patent Office; Notice on the First Office Action dated May 24, 2013 in Serial No. 201080036764.6.
Chinese Patent Office; Notice on the Second Office Action dated Jan. 2, 2014 in Serial No. 201080036764.6.
Japanese Patent Office; Office Action dated Dec. 25, 2014 in Serial No. 2012-504786.
USPTO; Office Action dated Oct. 8, 2014 in U.S. Appl. No. 12/763,037.
USPTO; Non-Final Office Action dated Sep. 17, 2014 in U.S. Appl. No. 13/187,300.
USPTO; Non-Final Office Action dated Nov. 26, 2014 in U.S. Appl. No. 13/312,591.
UPPTO; Notice of Allowance dated Oct. 21, 2014 in U.S. Appl. No. 13/439,528.
USPTO; Notice of Allowance dated Oct. 23, 2014 in U.S. Appl. No. 13/535,214.
USPTO; Non-Final Office Action dated Oct. 15, 2014 in U.S. Appl. No. 13/597,043.
USPTO; Final Office Action dated Nov. 14, 2014 in U.S. Appl. No. 13/677,151.
USPTO; Non-Final Office Action dated Oct. 9, 2014 in U.S. Appl. No. 13/874,708.
USPTO; Non-Final Office Action dated Sep. 19, 2014 in U.S. Appl. No. 13/791,246.
USPTO; Non-Final Office Action dated Sep. 12, 2014 in U.S. Appl. No. 13/941,134.
USPTO; Restriction Requirement dated Sep. 16, 2014 in U.S. Appl. No. 13/948,055.
USPTO; Non-Final Office Action dated Oct. 30, 2014 in U.S. Appl. No. 13/948,055.
USPTO; Final Office Action dated Nov. 7, 2014 in U.S. Appl. No. 14/183,187.
Chinese Patent Office; Notice on the Second Office Action dated Sep. 16, 2014 in Application No. 201110155056.
Koutsokeras et al. Texture and Microstructure Evolution in Single-Phase TixTal-xN Alloys of Rocksalt Structure. Journal of Applied Physics, 110, pp. 043535-1-043535-6, (2011).
USPTO; Final Office Action dated Jul. 14, 2014 in U.S. Appl. No. 12/754,223.
USPTO; Notice of Allowance dated Jul. 3, 2014 in U.S. Appl. No. 13/102,980.
USPTO; Office Action dated Jun. 3, 2014 in U.S. Appl. No. 12/854,818.
USPTO; Non-Final Office Action dated Jul. 2, 2014 in U.S. Appl. No. 13/283,408.
USPTO; Non-Final Office Action dated Jul. 30, 2014 in U.S. Appl. No. 13/284,642.
USPTO; Office Action dated Jul. 31, 2014 in U.S. Appl. No. 13/411,271.
USPTO Final Office Action dated Jul. 8, 2014 in U.S. Appl. No. 13/439,528.
USPTO; Final Office Action dated Jun. 18, 2014 in U.S. Appl. No. 13/535,214.
USPTO; Non-Final Office Action dated Aug. 8, 2014 in U.S. Appl. No. 13/563,066.
USPTO; Non-Final Office Action dated Jun. 2, 2014 in U.S. Appl. No. 13/677,151.
USPTO; Notice of Allowance dated Aug. 13, 2014 in U.S. Appl. No. 13/784,362.
USPTO; Restriction Requirement dated Jun. 26, 2014 in U.S. Appl. No. 13/874,708.
USPTO; Non-Final Office Action dated May 29, 2014 in U.S. Appl. No. 14/183,187.
Chinese Patent Office; Notice on the Third Office Action dated Jul. 1, 2014 in Application No. 201080036764.6.
Taiwan Patent Office; Office Action dated Jul. 4, 2014 in Application No. 099110511.
USPTO; Notice of Allowance dated Jan. 27, 2015 in U.S. Appl. No. 12/763,037.
USPTO; Final Office Action dated Jan. 29, 2015 in U.S. Appl. No. 13/283,408.
USPTO; Notice of Allowance dated Feb. 11, 2015 in U.S. Appl. No. 13/284,642.
USPTO; Final Office Action dated Jan. 16, 2015 in U.S. Appl. No. 13/411,271.
USPTO; Final Office Action dated Feb. 12, 2015 in U.S. Appl. No. 13/563,066.
USPTO; Non-Final Office Action dated Feb. 12, 2015 in U.S. Appl. No. 13/597,108.
USPTO; Notice of Allowance dated Feb. 26, 2015 in U.S. Appl. No. 13/677,151.
USPTO; Notice of Allowance dated Jan. 20, 2015 in U.S. Appl. No. 13/941,134.
USPTO; Non-Final Office Action dated Feb. 12, 2015 in U.S. Appl. No. 14/457,058.
USPTO; Non-Final Office Action dated Jan. 16, 2015 in U.S. Appl. No. 14/563,044.
Chinese Patent Office; Office Action dated Jan. 12, 2015 in Application No. 201080015699.9.
Chinese Patent Office; Notice on the Third Office Action dated Feb. 9, 2015 in Application No. 201110155056.
Japanese Patent Office; Office Action dated Dec. 1, 2014 in Application No. 2012-504786.
Taiwan Patent Office; Office Action dated Dec. 30, 2014 in Application No. 099114330.
Taiwan Patent Office; Office Action dated Dec. 19, 2014 in Application No. 099127063.

* cited by examiner

PROCESS GAS MANAGEMENT FOR AN INDUCTIVELY-COUPLED PLASMA DEPOSITION REACTOR

BACKGROUND

Some semiconductor fabrication processes have low thermal budgets. For example, some processes used to deposit films after the formation of the first metal interconnect layer may be deposited at a low temperature to avoid electromigration of the metal and potential damage to the device. Thus, thermal activation of some deposition reactions may be difficult under such conditions. Some previous approaches have attempted to employ easily decomposed molecules as starting points for film formation. However, these chemicals can be difficult to handle and may still suffer from low deposition rates. Other approaches have attempted to accelerate deposition using plasma energy. However, some devices may be sensitive to plasma damage under such conditions and some molecules may undergo undesirable reactions when exposed to plasma energy.

SUMMARY

Various embodiments are disclosed herein that relate to hardware and methods for processing a semiconductor substrate. In one embodiment, a film deposition reactor including an inductively-coupled plasma (ICP) comprises a process gas distributor including a plasma gas-feed inlet located to supply plasma gas to a plasma generation region within the film deposition reactor and a precursor gas-feed inlet located to supply film precursor gas downstream of the plasma generation region. The example film deposition reactor also includes an insulating confinement vessel configured to maintain a plasma generation region at a reduced pressure within the film deposition reactor and an ICP coil arranged around a portion of a sidewall of the insulating confinement vessel and positioned so that the sidewall separates the plasma generation region from the ICP coil. The example film deposition reactor further includes a susceptor configured to support the semiconductor substrate so that a film deposition surface of the semiconductor substrate is exposed to a reaction region formed downstream of the process gas distributor.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

Figure 1:
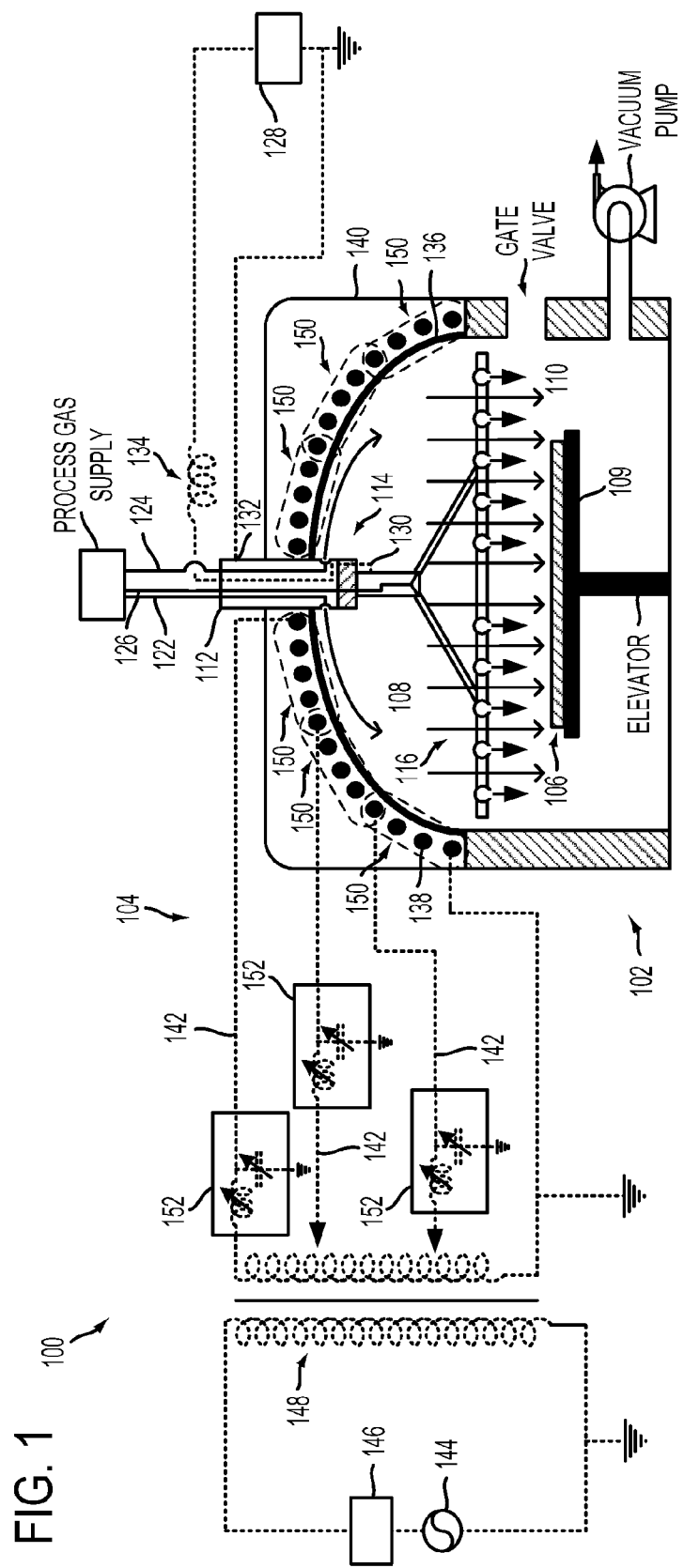
FIG. 1 schematically shows an example film deposition process reactor according to an embodiment of the present disclosure.

Semiconductor devices may include thin films formed by various deposition techniques. Chemical vapor deposition (CVD) and atomic layer deposition (ALD) processes are sometimes used to deposit films used in semiconductor device fabrication processes. In some settings, thermal budget considerations may affect film formation conditions. For example, supplying thermal energy suitable to activate some molecular decomposition processes in CVD or ALD processes may alter device performance depending on a particular manufacturing stage where the deposition process is to be used.

In response, some deposition processes activate using a plasma. For example, radicals formed from a suitable plasma gas may react with species already chemisorbed on the semiconductor substrate, or radical species may themselves chemisorb to the substrate. However, plasma activation may present challenges for some processes. For example, reactant molecules adsorbed to other surfaces in the reactor may be activated by the radicals. Such activation may potentially lead to film accumulation and/or particle formation on those surfaces that may cause defects in the device and/or the processing tool.

Accordingly, the disclosed embodiments relate to hardware and methods for processing a semiconductor substrate. In one embodiment, a film deposition reactor including an inductively-coupled plasma (ICP) comprises a process gas distributor including a plasma gas-feed inlet located to supply plasma gas to a plasma generation region within the film deposition reactor and a precursor gas-feed inlet located to supply film precursor gas downstream of the plasma generation region. The example film deposition reactor also includes an insulating confinement vessel configured to maintain a plasma generation region at a reduced pressure within the film deposition reactor and an ICP coil arranged around a portion of a sidewall of the insulating confinement vessel and positioned so that the sidewall separates the plasma generation region from the ICP coil. The example film deposition reactor further includes a susceptor configured to support the semiconductor substrate so that a film deposition surface of the semiconductor substrate is exposed to a reaction region formed downstream of the process gas distributor.

Thus, harnessing plasma energy to activate/enhance deposition reactions may avoid some performance-altering effects that may result from thermal activation. Introducing plasma-sensitive precursors downstream of a plasma generation region may prevent unwanted reaction of those precursors. For example, gas phase reactions or condensed phase reactions of plasma-sensitive precursors may potentially be avoided by the gas distribution schemes disclosed herein. In turn, film formation may be focused on the exposed substrate instead of various surfaces of the reactor, such as surfaces within the plasma generation region. Film deposited on such surfaces may cause Faraday shielding of plasma generation hardware, clogging in gas distribution nozzles, and/or the generation of small particles that may be transported to the substrate surfaces.

FIG. 1 schematically shows an embodiment of a semiconductor processing module 100 for processing a semiconductor substrate 106. Semiconductor processing module 100 includes a film deposition reactor 102 and an ICP system 104 comprising an RF power source and an ICP coil. Film deposition reactor 102 is configured to deposit one or more thin films on substrate 106 under low pressure conditions. For example, a plasma generated in a plasma generation region 108 is used to produce radicals. In turn, those radicals are supplied to substrate 106 for deposition of a selected film.

In the example shown in FIG. 1, substrate 106 is shown supported on a susceptor 109, which may be heated by a heater to provide thermal energy to substrate 106 in some embodiments. Further, in some embodiments, susceptor 109 may be raised or lowered by an elevator so that substrate 106 may be transferred in and out of reactor 102 and positioned within reaction region 110.

Film deposition reactor 102 includes a process gas distributor 112 configured to deliver gases suitable for direct plasma activation to plasma generation region 108 while delivering one or more other process gases to reaction region 110 without exposing them to plasma conditions. For example, process gas distributor 112 may supply one or more plasma gases and, in some embodiments, one or more reactant gases, to plasma generation region 108. Process gas distributor 112 may also supply one or more plasma-sensitive precursor gases to reaction region 110.

As used herein, a precursor gas refers to a plasma-sensitive process gas (e.g., process gases that may undergo undesirable reactions when exposed to plasma conditions, potentially leading to particle generation in some cases) that contributes matter to a film formed on a substrate in a film forming reaction. In some examples, precursor gases may include various metal-organic or metal-halide compounds having ligands that may easily be eliminated upon exposure to plasma energy. Process gases that are comparatively less sensitive to plasma conditions and that may either contribute to plasma generation (e.g., a plasma gas) or that may be desirably activated by a plasma, such as some reactant gases that may participate in film-forming reactions, may be supplied to reaction region 110 directly or from an upstream location. In turn, radicals and plasma-sensitive process gases may be supplied to reaction region 110 so that film deposition processing may proceed while potentially undesirable plasma-mediated reactions of the precursor gases may be mitigated.

Figure 2:
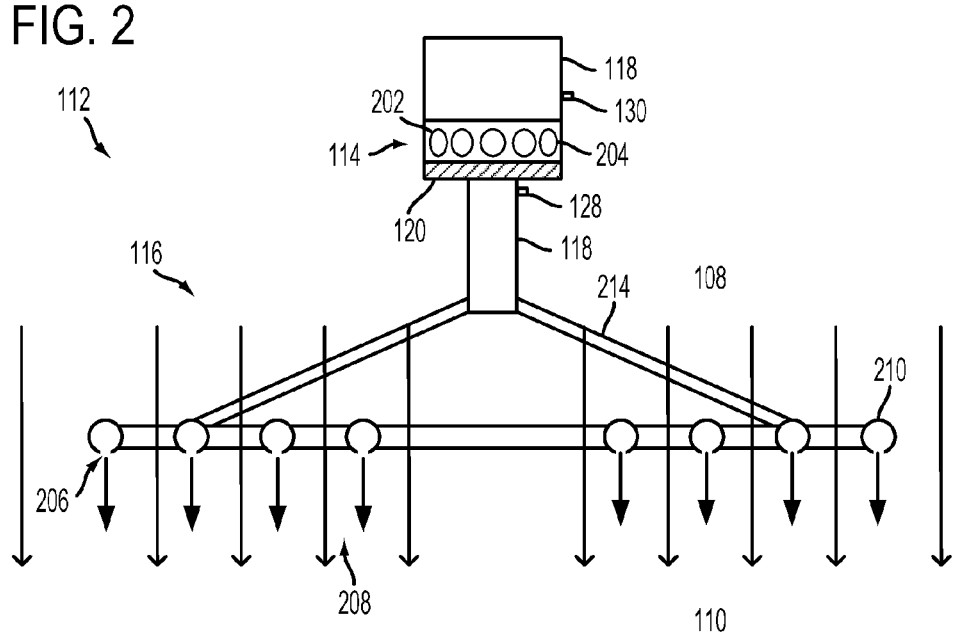
FIG. 2 schematically shows a cross-section of an example process gas distributor assembly according to an embodiment of the present disclosure.

FIG. 2 schematically shows an embodiment of a process gas distributor 112 for use with film deposition reactor 102. In the embodiment shown in FIG. 2, process gas distributor 112 includes a plasma gas distributor 114 and a precursor gas distributor 116. The gas distributors are supported by a support structure 118 and electrically separated from one another by an insulator 120 as described in more detail below. While the embodiment shown in FIG. 2 depicts a process gas distributor 112 that may be assembled from tube-style subunits (e.g., precursor gas distributor 116 may be fabricated from suitable tubing), it will be appreciated that process gas distributor 112 may be fabricated in any suitable way from any suitable materials.

Plasma gas distributor 114 includes one or more plasma gas-feed inlets 202. Plasma gas-feed inlets 202 are positioned to supply plasma gas to plasma generation region 108 within film deposition reactor 102. Any suitable configuration/orientation of plasma gas-feed inlets 202 may be employed without departing from the scope of the present disclosure. For example, in some embodiments, plasma gas-feed inlets 202 may be configured to contribute to the formation of a desired flow regime within plasma generation region 108. For example, a laminar flow regime may be generated within plasma generation region 108 to discourage formation of backflow and/or eddy currents that might dislodge and circulate small particles toward substrate 106 or that might cause precursor gas to be directed toward plasma generation region 108. In some embodiments, plasma gas-feed inlets 202 may be radially arranged, as shown in FIG. 2, or angled, or otherwise suitably oriented to direct exiting plasma gas within plasma generation region 108. Moreover, in some embodiments plasma gas-feed inlets 202 may include suitable nozzles, reducers and/or expanders to adjust the velocity of the exiting plasma gas.

Plasma gas is supplied to plasma gas-feed inlets 202 via one or more plasma gas supply lines (see plasma gas supply line 122 in FIG. 1). In some embodiments, plasma gas supply lines 122 may be arranged within support structure 118. Including gas supply lines within support structure 118 may protect the gas lines from damage during maintenance operations. Further, in some settings, the adventitious formation of conductive films on some gas lines may lead to unintended electrical leakage across insulator 120. Locating the gas lines within support structure 118 may prevent such film formation on the gas lines.

In some embodiments, plasma gas distributor 114 may include one or more reactant gas-feed inlets 204 positioned to supply reactant gas to plasma generation region 108. Reactant gas may be delivered to reactant gas-feed inlets 204 via a reactant gas supply line (see reactant gas supply line 124 in FIG. 1). In some embodiments, precursor gas supply lines 126 may be included within support structure 118. In some embodiments, reactant gas may be supplied to plasma generation region 108 via one or more plasma gas-feed inlets 202. In such embodiments, reactant gas may be supplied to plasma gas-feed inlets 202 via a dedicated reactant gas supply line or by feeding reactant gas through plasma gas supply lines 122.

Precursor gas distributor 116 includes a plurality of precursor gas-feed inlets 206 and a plurality of plasma pass-throughs 208. Precursor gas-feed inlets 206 are provided so that precursor gas is directed toward reaction region 110, and ultimately an exposed surface of substrate 106. Similarly, plasma pass-throughs 208 are openings provided in precursor gas distributor 116 so that radicals may be delivered to reaction region 110.

Plasma pass-throughs 208 deliver radicals generated in plasma generation region 108 to reaction region 110. It will be appreciated that plasma pass-throughs 208 of any suitable size may be included in any suitable number without departing from the scope of the present disclosure.

In some embodiments, a critical dimension for one or more plasma pass-throughs 208 may be sized in view of one or more dimensionless values reflective of flow and/or molecular kinetic conditions in an environment near precursor gas distributor 116 and/or within a plasma pass-through. As used herein, a critical dimension refers to a dimension that may be used during a design phase for precursor gas distributor 116.

The dimension is not intended to be a limiting dimension in any sense, but is described here for discussion purposes. In other words, the value may not be critical to the operation or function of the distributor or any other hardware disclosed herein. Instead, the critical dimension may serve as a reference value for other dimensions during design and fabrication.

In some embodiments, a critical dimension for one or more plasma pass-throughs 208 may be sized in view of the Mach number of the fluid. The Mach number is a dimensionless number relating the velocity of the radical to the speed of sound in the fluid the radical is traveling in at that pressure and temperature. Mach number may be expressed as:

$$M = \frac{V}{c(T \cdot P)}$$

where M is the Mach number, V is the fluid velocity, and c is the speed of sound for that fluid as a function of temperature and pressure. Without wishing to be bound by theory, a radical characterized with a higher Mach number may be less likely to be quenched while traveling through plasma pass-through 208 via collision relative to a radical characterized with a lower Mach number. This may result from a comparative probabilities of surface collisions or intermolecular collisions associated with the radicals.

In some embodiments, a critical dimension for one or more plasma pass-throughs 208 may be sized at least in part in view of the Knudsen number. The Knudsen number is a dimensionless number relating the mean free path of the radical to a characteristic physical dimension (e.g., the critical dimension) of the plasma pass-through expressed by:

$$Kn = \frac{\lambda}{l}$$

where Kn is the Knudsen number, λ is the critical dimension of plasma pass-through 208, and l is the radical mean free path. Put another way, plasma pass-throughs 208 may be sized so that so that a radical is unlikely to be quenched by a collision with a wall or surface defining a portion of a particular plasma pass-through 208 while traveling through it. In some conditions, the mean free path between collisions with plasma pass-through 208 may be approximated by a mean free path with respect to collision with another molecule or radical, as defined by:

$$l = \frac{k_B T}{\sqrt{2}\, \pi d^2 P}$$

where l is the mean free path, k is the Boltzmann constant, T is the temperature, d is the radical diameter, and P is the local pressure within that particular plasma pass-through 208. As Kn increases in magnitude, surface effects from sidewalls of plasma pass-through 208 may increase with respect to the mean free path of the radicals. Conversely, radical passage through plasma pass-through 208 may become more ballistic as Kn decreases in magnitude. Thus, in some embodiments, λ may be determined based at least in part on a selected Knudsen number.

It will be appreciated that the critical dimensions referred to above may include any suitable dimension that affects flow through plasma pass-throughs 208. For example, in some embodiments, a critical dimension may be a minor dimension or a minimum dimension for a plasma pass-through 208 in one direction. A critical dimension may represent the vertical dimension of the gap through which radicals pass towards the wafer, as shown in 116 of FIGS. 2 and 610 of FIGS. 6 and 7. Alternatively, the critical dimension may be regarded as the horizontal gap shown in the same figures. It will be appreciated that the ratio of the vertical gap to the horizontal gap constitutes a dimensionless aspect ratio, which may be an important consideration, as a high aspect ratio constitutes greater restriction and greater radical recombination loss than a gap with low aspect ratio.

Further, it will be appreciated that different plasma pass-throughs 208 may have different sizes according to positioning within precursor gas distributor 116. For example, in some embodiments, plasma pass-throughs 208 positioned farther from a center of precursor gas distributor 116 may have a larger opening relative to plasma pass-throughs 208 positioned closer to the center. Variation in plasma pass-through size (e.g., radial dependence in some embodiments) may compensate for upstream flow variation, such as in embodiments where a laminar flow profile exists upstream. For example, a laminar flow distribution in plasma generation region 108 may be reshaped toward a plug-flow distribution in reaction region 110.

Regardless of how plasma pass-throughs 208 are shaped and/or sized in precursor gas distributor 116, it will be appreciated that factors other than radical lifetime may be considered in some embodiments. For example, pass-throughs may be shaped and sized so that radical flow through the reactor is substantially unidirectional (e.g., from plasma generation region 108 toward reaction region 110) to avoid backstreaming of radicals and other process gases, including various plasma-sensitive precursors It will be appreciated that optimal gas flow may be effected by a slight pressure differential between the top and bottom of the showerhead. A slight pressure differential may help equalize flow across the diameter of the showerhead. However, a design to increase pressure differential may be balanced against a potential need to have a high proportion of the radicals surviving through the showerhead gaps.

Precursor gas distributor 116 also includes a plurality of precursor gas-feed inlets 206 that distribute precursor gas to reaction region 110 downstream of plasma generation region 108. Because the local flow of precursor gas may affect the film formation rate for that locality, in some embodiments, individual precursor gas-feed inlets 206 may be positioned and/or sized/shaped so that precursor gas has a selected flow profile toward substrate 106.

For example, in some embodiments, a radial distribution (with respect to a central axis of process gas distributor 112) of the number and/or size of precursor gas-feed inlets 206 may be selected to achieve a uniform flow (within an acceptable tolerance) of precursor at the outlet, within reaction region 110, and/or at an exposed surface of substrate 106. Assuming that a central point of substrate 106 is aligned with a central axis of process gas distributor 112, such a flow condition may enhance within-substrate film thickness uniformity. Of course, it will be understood that any suitable flow profile may be created to adjust any suitable film property, including bulk properties, interfacial properties, electrical properties, physical properties, and so on.

Figure 3:
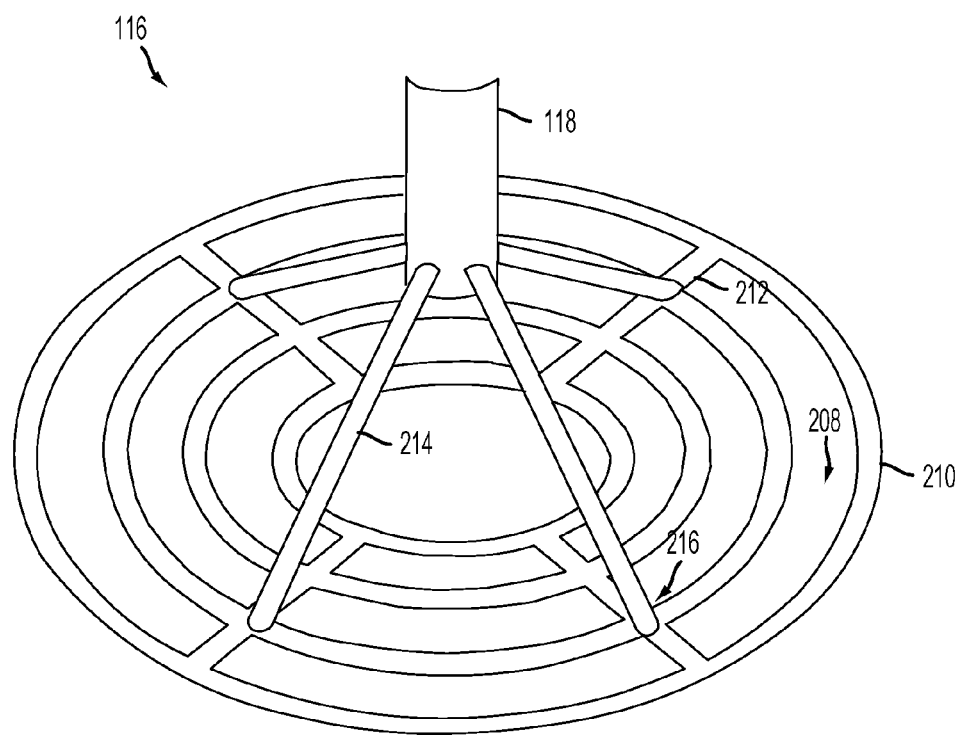
FIG. 3 schematically shows a perspective view of an example precursor gas distributor included in the process gas distributor illustrated in FIG. 2.

Precursor is supplied to precursor gas-feed inlets 206 via suitable gas distribution structures fluidly coupled with one or more precursor gas supply lines (see precursor gas supply line 126 in FIG. 1). In some embodiments, precursor gas supply lines 126 may be included within support structure 118. In the embodiment shown in FIG. 2, precursor gas distributor 116 includes a plurality of azimuthal precursor gas distributors 210 and a plurality of radial precursor gas distributors 212. FIG. 3 schematically shows a top perspective view of the embodiment of precursor distributor 116 shown in FIG. 2, and illustrates these structures with respect to one another and to plasma pass-throughs 208.

In the example shown in FIGS. 2 and 3, these distributors are configured so that precursor gas-feed inlets 206 may be arranged concentrically around support structure 118. Precursor gas-feed inlets 206 may be included in either or both of these distributors. So arranged, precursor gas may be distributed to reaction region 110 and the exposed surface of substrate 106 without substantially changing the flow direction of the radicals and/or plasma gas flowing through the reactor. Because alterations of flow may lead to defect generation and/or to thickness non-uniformity in some settings, the flow conditions depicted in FIGS. 2 and 3 (e.g., in a substantially downward direction) may reduce defect inclusion and/or thickness excursion potential during substrate processing.

In the example shown in FIGS. 2 and 3, each of a plurality of gas distribution arms 214 delivers a portion of the precursor gas from a precursor gas supply line included in support structure 118 to azimuthal precursor gas distributors 210 and radial precursor gas distributors 212 at a precursor gas entry location 216 positioned between a center and an outer edge of the precursor gas distributor 116. Dividing the precursor flow upstream of the gas entry location and delivering it as shown may help overcome pressure drop within azimuthal precursor gas distributors 210 and/or radial precursor gas distributors 212, potentially enhancing distribution efficiency to reaction region 110.

Figure 4:
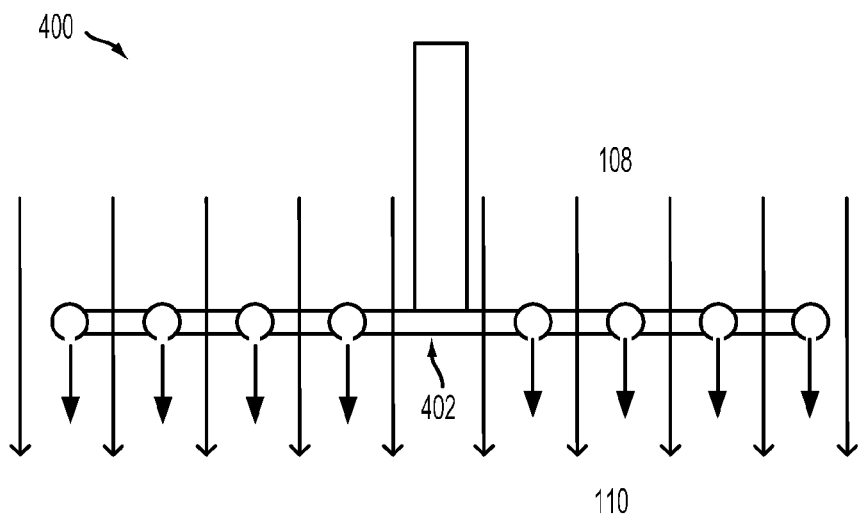
FIG. 4 schematically shows a cross-section of another example precursor gas distributor according to an embodiment of the present disclosure.
Figure 5:
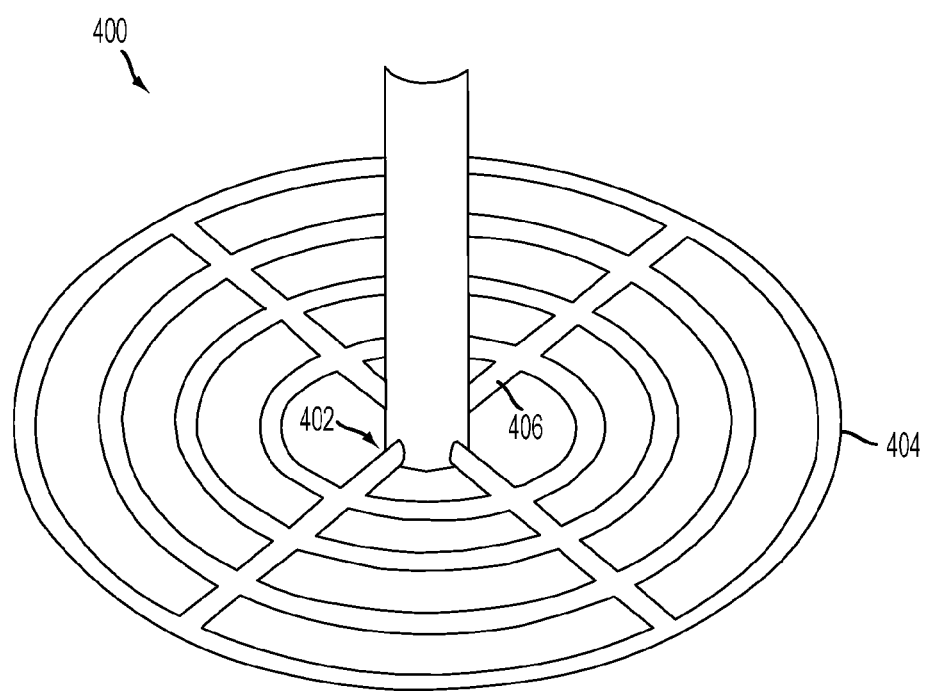
FIG. 5 schematically shows a perspective view of the example precursor gas distributor shown in FIG. 4.

It will be appreciated that any suitable precursor gas distributor may be employed without departing from the scope of the present disclosure. For example, FIG. 4 schematically shows a cross-sectional view of another embodiment of a precursor gas distributor 400, and FIG. 5 schematically shows a top perspective view of precursor gas distributor 400 as shown in FIG. 4. In the example shown in FIGS. 4 and 5, precursor gas is supplied at a precursor gas entry location 402 position at a center of precursor gas distributor 400. Supplying precursor gas from a central location may provide a simple, robust approach to distributing precursor gas using a less complex precursor gas distributor relative to the example shown in FIGS. 2 and 3. Once supplied from the central location, precursor gas is distributed via precursor gas-feed inlets that may be included in azimuthal precursor gas distributors 404 and/or radial precursor gas distributors 406.

Figure 6:
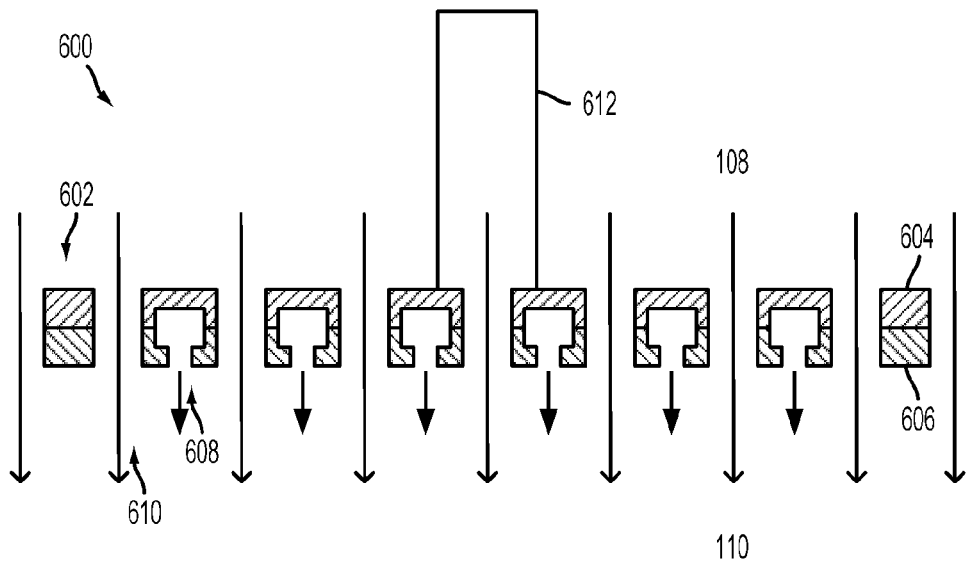
FIG. 6 schematically shows a cross-section of another example precursor gas distributor according to an embodiment of the present disclosure.
Figure 7:
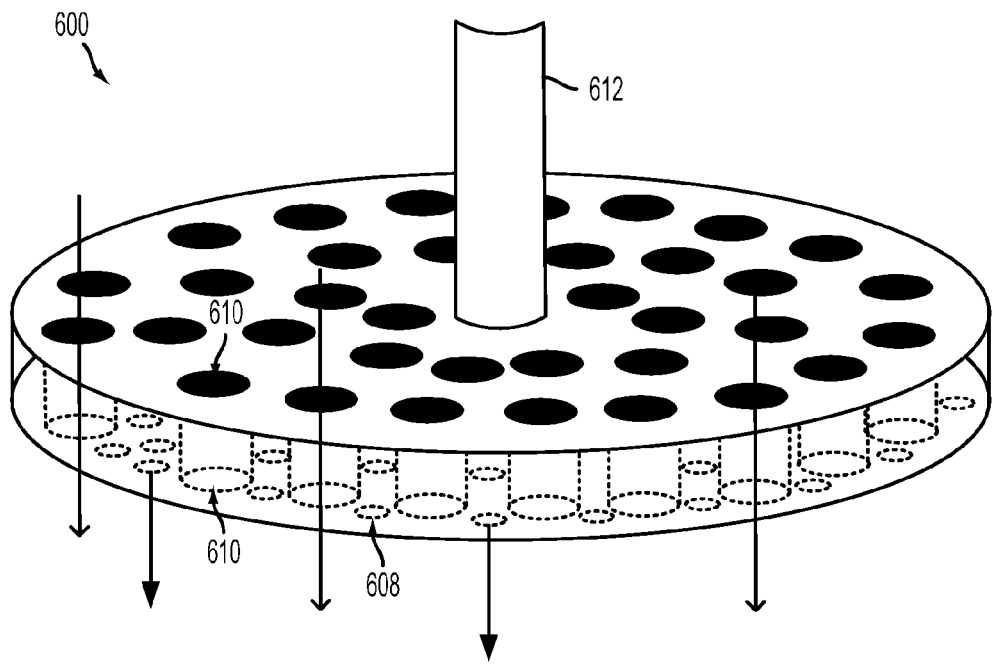
FIG. 7 schematically shows a perspective view of the example precursor gas distributor shown in FIG. 6.

As yet another example, FIG. 6 schematically shows a cross-section of an embodiment of a precursor gas distributor 600 that includes a no-mix showerhead assembly 602. FIG. 7 schematically shows a top perspective view of the embodiment of precursor gas distributor 600 shown in FIG. 6. As shown in FIG. 6, no-mix showerhead assembly 602 includes a top structure 604 and a bottom structure 606. When assembled, these structures form a plurality of precursor gas-feed inlets 608 and a plurality of plasma pass-throughs 610. No-mix showerhead assembly 602 is supported by support structure 612 so that precursor gas is introduced downstream of plasma generation region 108 (see FIG. 1). In the example shown in FIGS. 6 and 7, precursor gas is supplied from a precursor gas supply line included in support structure 612. Precursor gas distribution channels within no-mix showerhead assembly 602 route the precursor gas to precursor gas-feed inlets 608 for distribution to reaction region 110.

It will be appreciated that precursor gas may also be distributed via a showerhead configured to mix precursor gas and plasma/radical gases prior to delivery to reaction region 110 in some embodiments. For example, such mixing may take place within a suitable mixing showerhead but downstream of plasma generation region 108.

In some embodiments, precursor gas distributor 116 may include one or more reactant gas-feed inlets positioned to supply reactant gas to reaction region 110. Reactant gas may be delivered to such reactant gas-feed inlets via a reactant gas supply line or by feeding reactant gas through another suitable supply line, either of which may be included within support structure 118 in some embodiments.

Turning back to FIG. 2, plasma gas distributor 114 and precursor gas distributor 116 are supported by support structure 118. In the example shown in FIG. 2, support structure 118 co-axially supports plasma gas distributor 114 and precursor gas distributor 116, so that precursor gas distributor 116 extends from plasma gas distributor 114 along a common axis. Thus, in the embodiment shown in FIG. 2, process gas distributor 112 is supported from above by reactor 102 so that a gap is formed between precursor gas distributor 116 and a sidewall of reactor 102 (see FIG. 1). This may help maintain electrical isolation of precursor gas distributor 116 when screening ions as described in more detail below. While not shown in FIG. 1 or FIG. 2, it will be appreciated that one or more supplementary supports may be provided to brace precursor gas distributor 116 and/or process gas distributor 112 in some embodiments. For example, in one scenario one or more insulating braces may be provided at a circumferential edge of precursor gas distributor 116. Such braces may maintain an electrical and flow gap while aiding in the structural support of process gas distributor 112.

Centrally supporting the gas distributors may also position a central axis of process gas distributor 112 over a center of substrate 106. In turn, radial gas distribution into reaction region 110 and onto an exposed surface of substrate 106 may be comparatively enhanced relative to examples where one or more of the plasma or precursor gases are introduced from a side position. Put differently, directing the precursor gas within precursor gas distributor 116 to flow radially outward from the centrally-positioned support structure 118 toward an edge of precursor gas distributor 116 may enhance precursor gas distribution above the surface of substrate 106. In contrast, side injection of a gas into the gas distributor may lead to a non-uniform pressure distribution within the distributor. In turn, less gas may exit a side of the distributor away from the side injector relative to an exit position closer to the side injector. Substrate thickness and/or particle distribution may track the distribution non-uniformity in some processes, potentially leading to wedge-shaped thickness profiles and/or particle sprays. By providing gas flow to plasma gas distributor 114 and precursor gas distributor 116 relative to a centrally-positioned support structure 118, the disclosed embodiments may enhance radial gas distribution uniformity relative to a center of process gas distributor 112. In turn, the gas distribution profiles disclosed herein may be translated into radial uniformity relative to a center position of substrate 106.

Support structure 118 also includes an electrical insulator 120 disposed between plasma gas distributor 114 and precursor gas distributor 116 to accommodate a voltage difference between those distributors. Providing a voltage difference between the gas distributors may cause precursor gas distributor 116 to act as an ion filter for plasma generation region 108. In turn, radicals may be supplied to reaction region 110 while ions are filtered out, potentially reducing ion bombardment damage to substrate 106. In the embodiment shown in FIG. 1 bias source 128 is electrically coupled with precursor gas distributor 116 via a first electrical connection 130 and with plasma gas distributor 114 via a second electrical connection 132.

For example, FIG. 1 shows a bias source 128 adapted to establish a voltage difference between plasma gas distributor 114 and precursor gas distributor 116. Ions generated in plasma generation region 108 may be collected by precursor gas distributor 116. In some embodiments, bias source 128 may include a suitable DC power supply. In some other embodiments, bias source 128 may be a ground.

In some embodiments, a choke 134 may be electrically coupled with bias source 128. Choke 134 may prevent radio frequency energy from entering and damaging bias source 128. It will be appreciated that suitable choke(s) may be included in other power sources, gas lines, cooling lines, and so on to mitigate RF leakage as described herein.

The example film deposition reactor also includes an insulating confinement vessel 136 configured to separate plasma generation region 108 from ambient conditions. Thus, insulating confinement vessel 136 may act with a vacuum source (see FIG. 1) so that plasma generation region 108 operates at a reduced pressure relative to the ambient. In the example shown in FIG. 1, an ICP coil 138 for inducing a plasma within plasma generation region 108 is arranged around a portion of a sidewall of insulating confinement vessel 136. An electromagnetic shield 140 covers ICP coil 138 to screen electromagnetic fields generated by ICP coil 138 from the ambient environment. Insulating confinement vessel 136 may be formed from any suitable electrically-insulating material. For example, in some embodiments, quartz may be used to form insulating confinement vessel 136, though other dielectric materials may be employed in some embodiments.

Various mass transfer and/or kinetic processes during film formation may lead to radial thickness variation in the formed film or to radial variation in some other property (e.g., density, refractive index, etc.). Thus, in some film formation processes, it may be helpful to vary the radial density of radicals within reaction region 110. In some embodiments, the radial distribution of radicals may be adjusted by adjusting flow dynamics within plasma generation region 108.

In some embodiments, flow within plasma generation region 108 may be adjusted to form a laminar flow regime. In theory, a laminar flow regime avoids turbulence, so that a fluid element positioned away from a boundary layer may remain at approximately the same radial position within a constant-diameter portion of a flow path. Thus, a laminar flow regime may provide a stable, predictable flow regime for radical transport.

Figure 8:
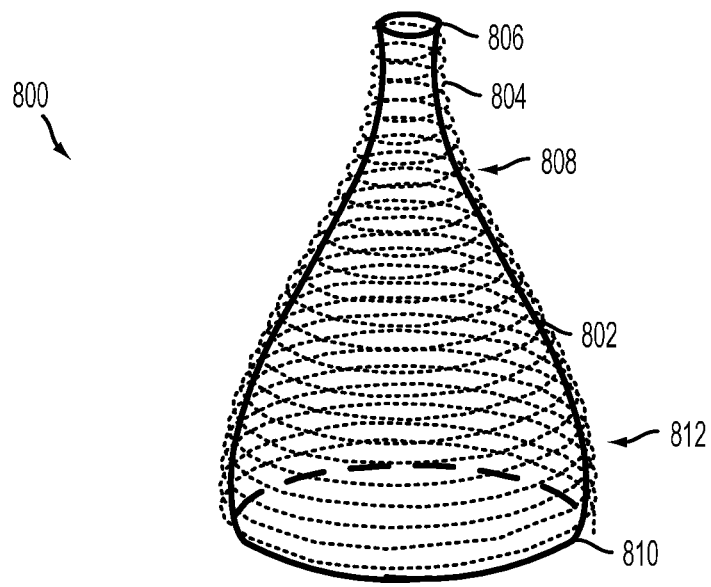
FIG. 8 schematically shows an example of an insulating confinement vessel having a sidewall with a laminar flow profile according to an embodiment of the present disclosure.

In some embodiments, such flow regimes may be created by selective shaping of insulating confinement vessel 136. For example, FIG. 8 illustrates an embodiment of an insulating confinement vessel 800 having a sidewall 802 exhibiting, on a low-pressure face (e.g., a face of sidewall 802 exposed to a low pressure environment such as plasma generation region 108), a profile conducive to forming laminar flow within the vessel under typical flow conditions. In the embodiment shown in FIG. 8, an example ICP coil placement position 804 is shown around an outside surface of sidewall 802 to illustrate that a plasma generation region 108 may be formed therein. In the example shown in FIG. 8, sidewall 802 exhibits a cross-section that curves inward toward a central axis of symmetry near inlet 806 (see 808 in FIG. 2) and then reverses to curve outward near outlet 810 (see 812 in FIG. 2) if viewed in cross-section taken along the central axis. The bottle-shaped vessel illustrated in FIG. 8 may, in some embodiments, enhance radial distribution of radicals so that the flux of radicals toward the exposed surface of substrate 106 may be more evenly distributed across the surface when compared to vessels that do not provide laminar flow regimes.

Figure 9:
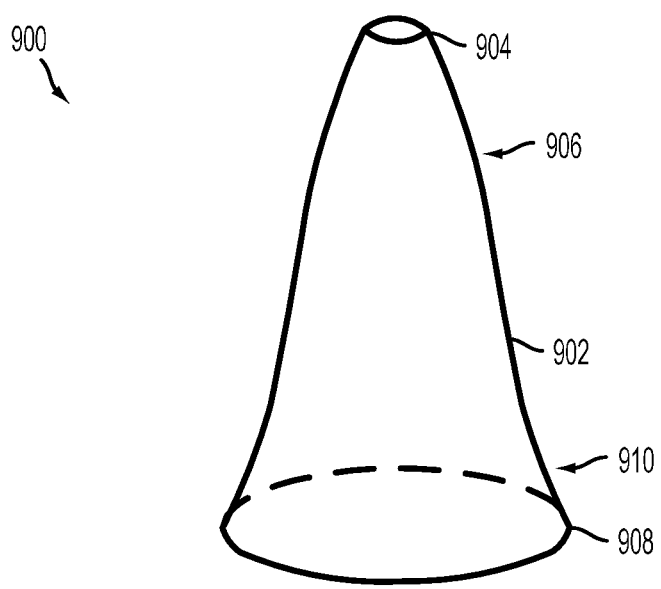
FIG. 9 schematically shows another example of an insulating confinement vessel having a sidewall with a laminar flow profile according to an embodiment of the present disclosure.

As another example, FIG. 9 shows an embodiment of an insulating confinement vessel 900 having a sidewall 902 exhibiting, on a low-pressure face (e.g., a face of sidewall 902 exposed to a low pressure environment such as plasma generation region 108), a profile conducive to forming laminar flow within the vessel under typical flow conditions. For clarity, FIG. 9 does not illustrate an example ICP coil placement position, though it will be appreciated that a plasma generation region 108 may be formed therein. In the example shown in FIG. 9, sidewall 902 exhibits a cross-section that curves outward toward a central axis of symmetry near inlet 904 (see 906 in FIG. 2) and then reverses to curve inward near outlet 908 (see 910 in FIG. 2) if viewed in cross-section taken along the central axis. The horn-shaped vessel illustrated in FIG. 9 may also enhance the radial distribution of radicals so that the flux of radicals toward the exposed surface of substrate 106 may be more evenly distributed across the surface.

It will be appreciated that laminar profiles may be generated with any suitable shape, including vessels having sidewalls with profiles exhibiting intermediate shapes to those shown in FIGS. 8 and 9. For example, in some embodiments, a vessel having a laminar profile may exhibits a cross-section that is monotonic in some aspect (e.g., horn-shaped). In some embodiments, laminar flow regimes may also be created and/or controlled by suitable adjustment of gas flow rates, etc. within the reactor.

It will be appreciated that the radial distribution of radicals may also be adjusted dynamically (e.g., during processing and/or without altering the shape of plasma generation region 108. For example, FIG. 1 depicts ICP coil 138 as a single coil including a plurality of plasma density adjustment taps 142 for varying plasma density within respective plasma generation region 108. Power for generating plasma is supplied to ICP coil 138 from an ICP power source 144 and matching network 146 via a multi-tap transformer 148. Each of the plasma density adjustment taps 142 may be adjusted to vary power within corresponding plasma zones 150. Varying power within each plasma zone 150 changes the generation rate of radicals, effectively altering the radial distribution of radicals within plasma generation region 108.

Use of a single ICP coil 138 with a plurality of plasma density adjustment taps 142 may provide a comparatively less complex approach to varying plasma density relative to systems including a plurality of coils and associated power supplies. Alternatively, in some embodiments, ICP system 104 may include a plurality of independent ICP coils and associated power supplies capable of independently varying plasma density within plasma zones 150.

In the embodiment shown in FIG. 1, each plasma density adjustment tap 142 includes a plasma density tuner 152 used to adjust power in each plasma zone 150. As shown in FIG. 1, plasma density tuners 152 include components used to adjust zone attenuation (for example, via a variable capacitor) and zone phase shift (for example, via a variable inductor). In some embodiments, plasma density tuners 152 may be purely passive/reactive, including no transistors or other active components.

It will be appreciated that the laminar flow regimes discussed above may provide a predictable, stable flow in which radical populations may be adjusted on a zone-by-zone basis in some embodiments. Put differently, radicals may be generated within plasma generation region 108 according to a selected radial distribution. Those radicals may then be moved, with little turbulent mixing, toward reaction region 110 via a suitable laminar flow regime created within the reactor, potentially providing a selected radical distribution at an exposed surface of substrate 106. Meanwhile, precursor gas may also be supplied to an exposed surface of substrate 106 without exposing the precursor gas to plasma generation region 108. In turn, a film may be formed on substrate 106 exhibiting comparatively fewer particle defects and/or exhibiting a selected radial profile of an electrical or physical property.

Figure 10:
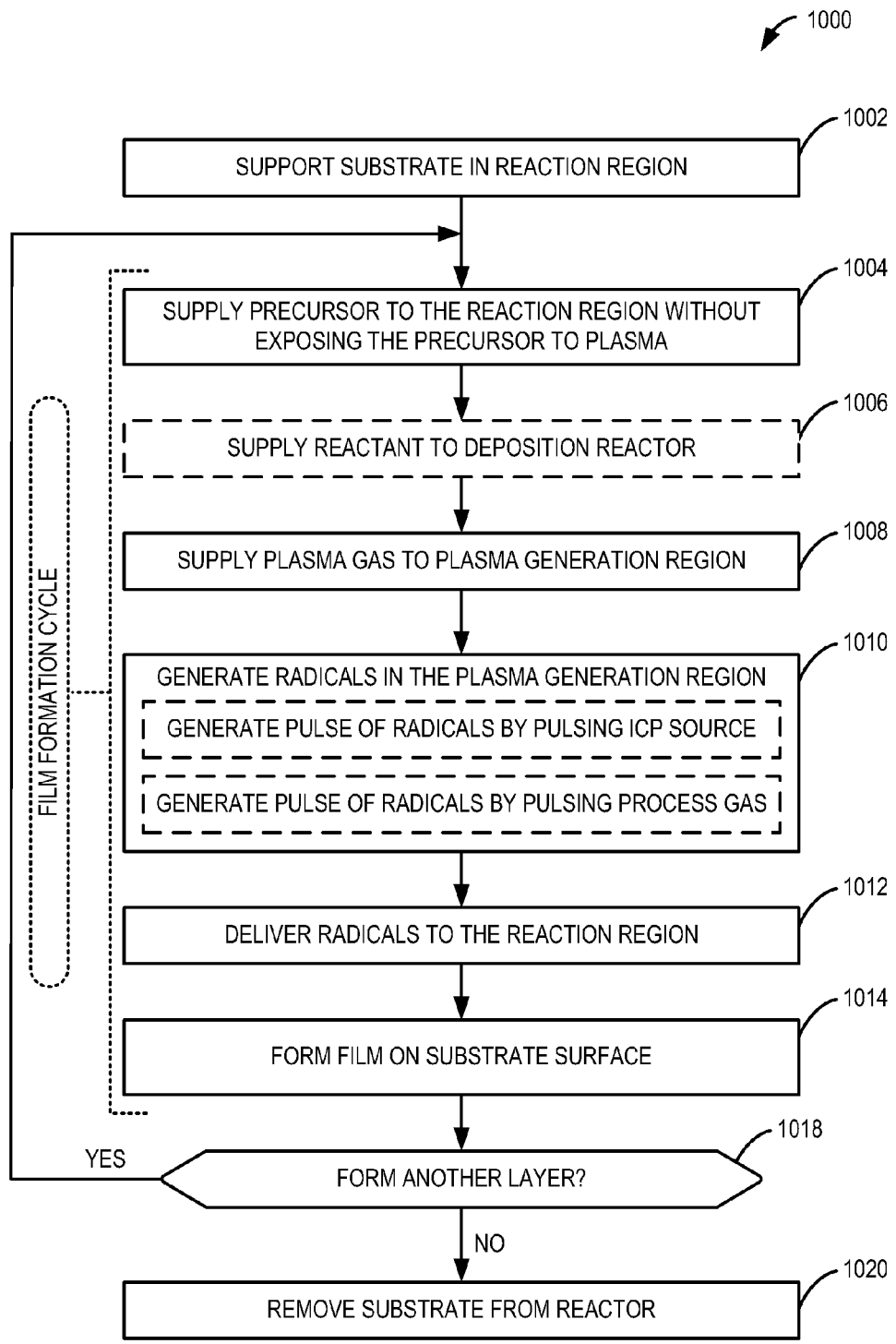
FIG. 10 shows a flowchart for an example method of processing a semiconductor substrate according to an embodiment of the present disclosure.

As an example, FIG. 10 shows a flow chart illustrating an embodiment of a method 1000 of forming a film on a semiconductor substrate in an inductively-coupled plasma (ICP) processing tool. It will be appreciated that embodiments of method 1000 may be performed by any suitable hardware, including the hardware disclosed herein. Further, it will be appreciated that portions of the processes described in method 1000 may be omitted, reordered, and/or supplemented without departing from the scope of the present disclosure.

At 1002, method 1000 includes supporting the semiconductor substrate on a susceptor so that the semiconductor substrate is exposed to a reaction region within an inductively-coupled plasma (ICP) processing tool. In some embodiments, supporting the substrate in the reactor may include adjusting one or more reactor conditions, such as temperature, pressure, and/or carrier gas (e.g., Ar, $N_2$, or He) flow rate, to conditions suitable for film formation prior to processing the substrate. It will be appreciated that such film formation conditions may vary according to film deposition process chemistry, substrate surface termination, and so on.

For example, reactor conditions may be adjusted to facilitate the formation of surface active species from suitable film precursors by activating surface adsorption and decomposition processes. In some scenarios, reactor conditions may be adjusted to avoid gas phase decomposition reactions for one or more process gases, potentially avoiding film contamination from decomposition products and/or poor step coverage resulting from diffusion effects. Further, in some scenarios, reactor conditions may be adjusted to avoid condensation of process gases on various reactor surfaces, potentially avoiding small particle defect generation processes.

In the example shown in FIG. 10, method 1000 enters a film formation cycle after supporting the substrate in the reactor at 1002. As used herein, a film formation cycle refers to a film formation event that includes a single exposure of the precursor to the substrate and a single exposure of radicals to the substrate. It will be appreciated that any suitable adjustments to the reactor conditions may be made during the film formation cycle, including adjustments to temperature, pressure, and/or the flow rates of various gases supplied to the reactor during the film formation cycle. The film formation cycle shown in FIG. 10 includes processes 1004 through 1014. It will be appreciated that the arrangement and order of processes shown in the film formation cycle depicted in FIG. 10 are provided for illustrative purposes only, and may be varied in any suitable way in some embodiments.

At 1004, method 1000 includes supplying precursor gas to the reaction region. Because the precursor may be sensitive to plasma (e.g., because the precursor may undesirably react in the presence of plasma), the precursor is introduced to the reaction region without exposing the precursor to plasma conditions. For example, the precursor may be introduced to the reaction region via a suitable precursor gas distributor. It will be appreciated that the amount of precursor gas supplied to the reaction region may vary depending on, among other factors, the topography of the exposed surface of the substrate, the film formation conditions present in the reaction region, and the adsorption rate and/or the sticking coefficient of the precursor on the surface under those conditions.

Supplying precursor gas to the reaction region at 1004 includes adsorbing reactive precursor intermediates to an exposed surface of the semiconductor substrate. Without wishing to be bound by theory, as the precursor is supplied to the reaction region, gas phase molecules of the precursor may adsorb on the exposed surface of the substrate. Some of the gas phase molecules may become chemically adsorbed (e.g., chemisorbed) to the surface at sites on the surface that activate such chemisorption reactions. Such chemisorbed species may form surface-active intermediate species of the precursor. Because such intermediate species are bound to at least one surface site until a further reaction occurs, adsorption of the precursor may occur in a self-limiting manner. In turn, the film formed during a film formation cycle may be moderated at least in part by the surface reactions of the active species with a subsequently-supplied reactant, as described in more detail below.

After the precursor is supplied to the reaction region and intermediates become adsorbed to the substrate, residual precursor is typically removed. Thus, supplying precursor gas to the reaction region at 1004 may include removing the precursor from the reaction region in some embodiments. Removing the precursor from the reaction region includes removing gas phase molecules of the precursor and molecules of the precursor that are condensed on the surface but that are not chemically adsorbed to it. Such physically adsorbed (e.g., physisorbed) molecules may be condensed on the surface in more than one layer or may be distributed in non-uniform ways (such as being condensed within narrow openings formed in the exposed surface). Removing non-chemisorbed precursor molecules may prevent reaction of such molecules with subsequently-introduced reactant and/or may assist with deposition thickness control. Put another way, removing residual precursor may avoid non-uniform, non-conformal film formation and/or small particle defect generation. It will be appreciated that any suitable approach for removing residual precursor from the reaction region may be employed without departing from the scope of the present disclosure. For example, in some embodiments, the reactor may be evacuated to a base pressure. Additionally or alternatively, in some embodiments, the reactor may be supplied with a suitable displacement gas, such as Ar, $N_2$, or He.

Once chemisorbed to the surface, the precursor intermediates await plasma-activated reaction to complete the film layer. As discussed in more detail below, in some embodiments, the precursor intermediates may react directly with reactant radicals (e.g., plasma-activated reactant formed in a plasma generation region and supplied to the reaction region), while in other embodiments the radicals may themselves chemisorb to the substrate.

Further, in some embodiments, reactant may be supplied to the reaction region and the substrate surface prior to plasma generation and radical delivery, as illustrated at 1006. For example, the reactant gas may be introduced to a plasma generation region via a suitable plasma gas distributor and allowed to flow downstream into the reaction region. In another example, the reactant gas may be introduced to the reaction region via a suitable precursor gas distributor. Once supplied, reactant species may adsorb to the substrate surface. Thus, in some embodiments, supplying reactant to the reaction region may include adsorbing reactive reactant intermediates to the substrate.

If a reactant gas is provided at 1006, in some embodiments, process 1006 may also include removing residual reactant gas. Removing residual reactant may avoid non-uniform, non-conformal film formation and/or small particle defect generation. It will be appreciated that any suitable approach for removing residual reactant from the reaction region may be employed without departing from the scope of the present disclosure. For example, in some embodiments, the reactor may be evacuated to a base pressure. Additionally or alternatively, in some embodiments, the reactor may be supplied with a suitable displacement gas, such as Ar, $N_2$, or He. Alternatively, in some embodiments, reactant gas may remain in the reaction region and/or the plasma generation region in preparation for plasma generation, discussed in more detail below.

Process 1006 may also include removing residual reactant gas. Removing residual reactant may avoid non-uniform, non-conformal film formation and/or small particle defect generation. It will be appreciated that any suitable approach for removing residual reactant from the reaction region may be employed without departing from the scope of the present disclosure. For example, in some embodiments, the reactor may be evacuated to a base pressure. Additionally or alternatively, in some embodiments, the reactor may be supplied with a suitable displacement gas, such as Ar, $N_2$, or He. Alternatively, in some embodiments, reactant gas may remain in the reaction region and/or the plasma generation region in preparation for plasma generation, discussed in more detail below.

At 1008, method 1000 includes supplying a plasma gas to the plasma generation region, and, at 1010, generating radicals from the plasma gas in the plasma generation region so that a pulse of radicals is generated with the plasma. In one non-limiting example, plasma power may be cycled on and off to create a radical pulse. In another example, a plasma may be maintained in the plasma generation region while a selected plasma gas and/or reactant gas is pulsed into the plasma generation region to generate a radical pulse.

It will be appreciated that plasma gas may be introduced to the plasma generation region in any suitable way. For example, the plasma gas may be introduced to the plasma generation region via a suitable plasma gas distributor. Further, any suitable plasma gas may be supplied. Non-limiting examples include Ar, $H_2$, and He.

It will also be appreciated that any suitable manner of generating a plasma may be employed without departing from the scope of the present disclosure. For example, a suitable ICP source and coil may be used to strike a plasma in the plasma generation region. In some embodiments, plasma density during radical generation may be adjusted within the plasma generation region via one or more plasma density adjustment taps electrically coupled with the ICP coil or by varying power supplied to independent ICP coils. Adjustment of the plasma density in plasma zones may provide an approach to adjusting radial plasma density within the plasma generation region and within the reaction region downstream. Further, in some embodiments, ions generated during plasma generation may be filtered using a suitable ion filter. For example, the precursor gas distributor described above may be used with a bias source to filter ions from the gas stream. Collecting the ions may avoid potential ion bombardment damage to the substrate surface.

In some embodiments, reactant radicals may be generated from reactant gas present in/supplied to reaction region during plasma generation. In other words, a non-reactive plasma may be used to generate reactant radicals for delivery to the substrate surface and subsequent reaction with the precursor intermediates adsorbed thereon. In some embodiments, radicals from a reactive plasma (e.g., a reactive plasma gas) may be supplied to the substrate surface for reaction.

At 1012, method 1000 includes delivering radicals to the reaction region. For example, radicals may be delivered to the reaction region via plasma pass-throughs included in a precursor gas distributor like those described herein. Once delivered to the reaction region, the radicals react with surface-adsorbed intermediates to form a layer of film. Thus, method 1000 includes, at 1014, forming film on the substrate surface. In some embodiments, forming the film may include reacting radicals with precursor intermediates adsorbed to the exposed surface to form the film. For example, radicals may react directly with adsorbed precursor intermediates to form a film layer. In some other embodiments, forming the film may include reacting radicals with precursor intermediates and reactant intermediates adsorbed to the exposed surface to form the film. For example, radicals may activate a reaction between adsorbed reactant and precursor intermediates on the surface. In still other embodiments, forming the film may include activating gas phase reactions between the radicals and gas phase reactant in the reaction region that trigger surface reactions with surface-adsorbed precursor intermediates.

After forming the film, in some embodiments, the plasma power may be switched off and residual radicals may be removed from the plasma generation region and the reaction region. It will be appreciated that any suitable approach for removing residual plasma gas may be employed without departing from the scope of the present disclosure. For example, in some embodiments, the reactor may be evacuated to a base pressure. Additionally or alternatively, in some embodiments, the reactor may be supplied with a suitable displacement gas, such as Ar, $N_2$, or He. Alternatively, in some embodiments, plasma gas may remain in the reactor while the plasma power is switched off.

Because the film layer may be formed via a self-limiting adsorption and reaction process, in some embodiments, each film formation cycle may yield a predictable thickness of film, within an acceptable tolerance. Consequently, in some of such embodiments, any suitable thickness of film may be formed by repeating the film formation cycle a suitable number of times. Thus, method 1000 includes, at 1018, determining whether to form another layer of film. If another layer is to be formed, method 1000 returns to 1004; if not, film formation is completed and the substrate is removed from the reactor at 1020.

While method 1000 generally describes an atomic layer deposition film formation process, it will be appreciated that any suitable film formation process may be employed without departing from the scope of the present disclosure. In some embodiments, the layer-by-layer film formation process provided by plasma-enhanced ALD (PEALD) may permit precise, predictable control of film thickness. However, in some embodiments, plasma-enhanced chemical vapor deposition (PECVD) may be employed, as PECVD techniques typically form films at a relatively faster deposition rate than PEALD processes.

Figure 11:
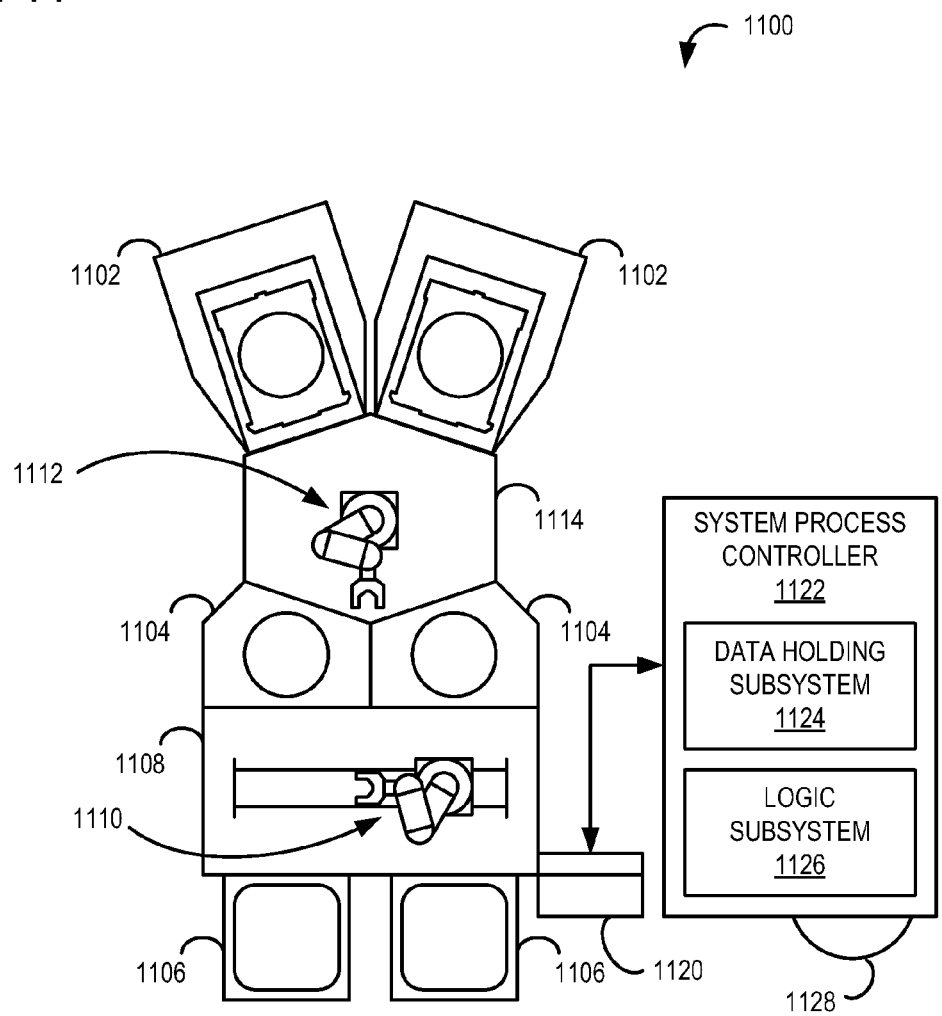
FIG. 11 schematically shows, according to an embodiment of the present disclosure, an example of a semiconductor processing tool including one or more film deposition process reactors.

In some embodiments, the film deposition reactors and the methods of forming films described herein may be formed using a suitable semiconductor processing tool. FIG. 11 schematically shows a top view of an embodiment of a semiconductor processing tool 1100 including a plurality of semiconductor processing modules 1102. While the depicted embodiment includes two modules, it will be appreciated that any suitable number of semiconductor processing modules may be provided. For example, some processing tools may include just one module while other processing tools may include more than two modules.

FIG. 11 also shows load locks 1104 for moving substrates between portions of semiconductor processing tool 1100 that exhibit ambient atmospheric pressure conditions and portions of the tool that are at pressures lower than atmospheric conditions. An atmospheric transfer module 1108, including an atmospheric substrate handling robot 1110, moves substrates between load ports 1106 and load locks 1104, where a portion of the ambient pressure is removed by a vacuum source (not shown) or is restored by backfilling with a suitable gas, depending on whether substrates are being transferred into or out of the tool. Low-pressure substrate handling robot 1112 moves substrates between load locks 1104 and semiconductor processing modules 1102 within low-pressure transfer module 1114. Substrates may also be moved among the semiconductor processing modules 1102 within low-pressure transfer module 1114 using low-pressure substrate handling robot 1112, so that sequential and/or parallel processing of substrates may be performed without exposure to air and/or without a vacuum break.

FIG. 11 also shows a user interface 1120 connected to a system process controller 1122. User interface 1120 is adapted to receive user input to system process controller 1122. User interface 1120 may optionally include a display subsystem, and suitable user input devices such as keyboards, mice, control pads, and/or touch screens, for example, that are not shown in FIG. 11.

FIG. 11 shows an embodiment of a system process controller 1122 provided for controlling semiconductor processing tool 1100. System process controller 1122 may operate process module control subsystems, such as gas control subsystems, pressure control subsystems, temperature control subsystems, electrical control subsystems, and mechanical control subsystems. Such control subsystems may receive various signals provided by sensors, relays, and controllers and make suitable adjustments in response.

System process controller 1122 comprises a computing system that includes a data-holding subsystem 1124 and a logic subsystem 1126. Data-holding subsystem 1124 may include one or more physical, non-transitory devices configured to hold data and/or instructions executable by logic subsystem 1126 to implement the methods and processes described herein. Logic subsystem 1126 may include one or more physical devices configured to execute one or more instructions stored in data-holding subsystem 1124. Logic subsystem 1126 may include one or more processors that are configured to execute software instructions.

In some embodiments, such instructions may control the execution of process recipes. Generally, a process recipe includes a sequential description of process parameters used to process a substrate, such parameters including, but not limited to, time, temperature, pressure, and concentration, as well as various parameters describing electrical, mechanical, and environmental aspects of the tool during substrate processing. The instructions may also control the execution of various maintenance recipes used during maintenance procedures.

In some embodiments, such instructions may be stored on removable computer-readable storage media 1128, which may be used to store and/or transfer data and/or instructions executable to implement the methods and processes described herein, excluding a signal per se. It will be appreciated that any suitable removable computer-readable storage media 1128 may be employed without departing from the scope of the present disclosure. Non-limiting examples include DVDs, CD-ROMs, floppy discs, and flash drives.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and subcombinations of the various processes, systems and configurations, and other features, functions, acts, and/or properties disclosed herein, as well as any and all equivalents thereof.

The invention claimed is:

1. A film deposition reactor for processing a semiconductor substrate using an inductively-coupled plasma (ICP), the film deposition reactor comprising:
   a process gas distributor including:
      a support structure;
      a plasma gas distributor supported by the support structure, the plasma gas distributor comprising a plasma gas-feed inlet located to supply plasma gas to a plasma generation region within the film deposition reactor, and
      a precursor gas distributor supported by the support structure, the precursor gas distributor comprising a precursor gas-feed inlet located to supply film precursor gas downstream of the plasma generation region;
   an insulating confinement vessel configured to maintain the plasma generation region at a reduced pressure within the film deposition reactor;
   an ICP coil arranged around a portion of a sidewall of the insulating confinement vessel and positioned so that the sidewall separates the plasma generation region from the ICP coil; and
   a susceptor configured to support the semiconductor substrate so that a film deposition surface of the semiconductor substrate is exposed to a reaction region formed downstream of the process gas distributor.

2. The film deposition reactor of claim 1, where the process gas distributor further comprises:
   an electrical insulator disposed between the plasma gas distributor and the precursor gas distributor to accommodate a voltage difference between the plasma gas distributor and the precursor gas distributor;
   where the support structure includes a precursor gas supply line fluidly coupled to the precursor gas-feed inlet and a plasma gas supply line fluidly coupled to the plasma gas-feed inlet.

3. The film deposition reactor of claim 2, where the plasma gas distributor includes a reactant gas-feed inlet fluidly coupled to a reactant gas supply line included in the support structure.

4. The film deposition reactor of claim 2, where the precursor gas distributor comprises a plurality of azimuthal precursor gas distributors and a plurality of radial precursor gas distributors, and where the precursor gas distributor comprises a plurality of plasma pass-through openings formed between the plurality of azimuthal precursor gas distributors and the plurality of radial precursor gas distributors.

5. The film deposition reactor of claim 4, where the plurality of radial precursor gas distributors includes a precursor gas entry location positioned at a center of the precursor gas distributor.

6. The film deposition reactor of claim 4, where the plurality of radial precursor gas distributors includes one or more precursor gas entry locations positioned between a center and an outer edge of the precursor gas distributor.

7. The film deposition reactor of claim 2, where the precursor gas distributor comprises a no-mix showerhead assembly including a plurality of precursor gas-feed inlets and a plurality of plasma pass-through openings.

8. The film deposition reactor of claim 1, where a low-pressure sidewall of the insulating confinement vessel has a laminar flow profile.

9. The film deposition reactor of claim 1, where the ICP coil is a single coil including a plurality of plasma density adjustment taps coupled to a single power transformer.

10. The film deposition reactor of claim 1, further comprising a plurality of ICP coils each having an independent RF power source.

11. A process gas distribution assembly for a film deposition reactor configured to process a semiconductor substrate using an inductively-coupled plasma (ICP), the process gas distribution assembly comprising:
- a support structure including a precursor gas supply line and a plasma gas supply line;
- a plasma gas distributor supported by the support structure, the plasma gas distributor including one or more plasma gas-feed inlets fluidly coupled to the plasma gas supply line;
- a precursor gas distributor supported by the support structure and extending away from the plasma gas distributor, the precursor gas distributor including one or more precursor gas-feed inlets fluidly coupled to the precursor gas supply line; and
- an electrical insulator disposed between the plasma gas distributor and the precursor gas distributor to accommodate a voltage difference between the plasma gas distributor and the precursor gas distributor.

12. The process gas distribution assembly of claim 11, where the support structure co-axially supports the plasma gas distributor and the precursor gas distributor.

13. The process gas distribution assembly of claim 11, where the precursor gas distributor comprises a plurality of azimuthal precursor gas distributors and a plurality of radial precursor gas distributors, and where the precursor gas distributor comprises a plurality of plasma pass-through openings formed between the plurality of azimuthal precursor gas distributors and the plurality of radial precursor gas distributors.

14. The process gas distribution assembly of claim 13, where the plurality of radial precursor gas distributors includes a precursor gas entry location positioned at a center of the precursor gas distributor.

15. The process gas distribution assembly of claim 13, where the plurality of radial precursor gas distributors includes one or more precursor gas entry locations positioned between a center and an outer edge of the precursor gas distributor.

16. The process gas distribution assembly of claim 11, where the precursor gas distributor comprises a no-mix showerhead assembly including a plurality of precursor gas-feed inlets and a plurality of plasma pass-through openings.

* * * * *